(12) United States Patent
Kang et al.

(10) Patent No.: US 12,156,592 B2
(45) Date of Patent: Dec. 3, 2024

(54) STRUCTURE FOR GROUND AND ELECTRONIC APPARATUS INCLUDING SAME

(71) Applicant: Samsung Electronics Co., Ltd., Gyeonggi-do (KR)

(72) Inventors: Doil Kang, Gyeonggi-do (KR); Minsoo Kim, Gyeonggi-do (KR); Jiwoo Lee, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 482 days.

(21) Appl. No.: 17/546,731

(22) Filed: Dec. 9, 2021

(65) Prior Publication Data
US 2022/0095794 A1 Mar. 31, 2022

Related U.S. Application Data

(63) Continuation of application No. PCT/KR2020/007253, filed on Jun. 4, 2020.

(30) Foreign Application Priority Data

Jun. 10, 2019 (KR) ........................ 10-2019-0067959

(51) Int. Cl.
*G06F 1/16* (2006.01)
*A47B 88/437* (2017.01)
*A47B 88/423* (2017.01)

(52) U.S. Cl.
CPC .......... *A47B 88/437* (2017.01); *G06F 1/1624* (2013.01); *A47B 88/423* (2017.01)

(58) Field of Classification Search
CPC .... A47B 88/437; A47B 88/423; G06F 1/1624
(Continued)

(56) References Cited

U.S. PATENT DOCUMENTS

| | | | |
|---|---|---|---|
| 7,877,123 B2 | 1/2011 | Abdul-Gaffoor et al. | |
| 8,564,945 B2* | 10/2013 | Nakao | H04M 1/0237 |
| | | | 361/679.55 |
| 2009/0075692 A1* | 3/2009 | Park | H04N 23/45 |
| | | | 455/556.1 |

(Continued)

FOREIGN PATENT DOCUMENTS

| | | |
|---|---|---|
| JP | 2006-203806 | 8/2006 |
| JP | 2009-232339 | 10/2009 |

(Continued)

OTHER PUBLICATIONS

PCT/ISA/210 Search Report issued on PCT/KR2020/007253, Sep. 28, 2020, pp. 6.

(Continued)

*Primary Examiner* — Zhengfu J Feng
(74) *Attorney, Agent, or Firm* — The Farrell Law Firm, P.C.

(57) ABSTRACT

Disclosed is an electronic device of a slide type and including a main body, a guide rail coupled with the main body and configured to enable rotational movement, a driving device coupled with the main body and configured to control the rotational movement of the guide rail, a guide structure coupled with the main body, a slide body; and a connector structure coupled with the slide body, wherein the connector structure is coupled with the guide rail to linearly move according to the rotational movement, wherein the slide body is flexibly disposed in a designated area according to the linear movement of the connector structure, and wherein one surface of the connector structure and one surface of the guide structure are configured to form an electrical connection.

18 Claims, 19 Drawing Sheets

(58) Field of Classification Search
USPC .......................................................... 361/748
See application file for complete search history.

(56) References Cited

U.S. PATENT DOCUMENTS

| | | | | |
|---|---|---|---|---|
| 2009/0137293 | A1* | 5/2009 | Yoo | H04N 7/142 |
| | | | | 455/575.4 |
| 2009/0181734 | A1* | 7/2009 | Kato | H04M 1/0237 |
| | | | | 455/575.4 |
| 2011/0188226 | A1 | 8/2011 | Kim | |
| 2011/0308852 | A1* | 12/2011 | Kobayashi | H04M 1/0237 |
| | | | | 53/473 |

FOREIGN PATENT DOCUMENTS

| | | | | |
|---|---|---|---|---|
| JP | 2013-106321 | | 5/2013 | |
| JP | 2013106321 A | * | 5/2013 | ............... H01Q 1/24 |
| KR | 10-2005-0056794 | | 6/2005 | |
| KR | 10-2006-0113814 | | 11/2006 | |
| KR | 10-2008-0004921 | | 1/2008 | |
| KR | 1020090077667 | | 7/2009 | |
| KR | 10-2010-0084757 | | 7/2010 | |
| KR | 20110115249 A | * | 10/2011 | .......... H04M 1/0237 |
| KR | 1020110115249 | | 10/2011 | |
| KR | 10-1096607 | | 12/2011 | |
| WO | WO-2006098590 A1 | * | 9/2006 | .......... H04M 1/0237 |

OTHER PUBLICATIONS

PCT/ISA/237 Written Opinion issued on PCT/KR2020/007253, Sep. 28, 2020, pp. 6.
Korean Office Action dated Jun. 14, 2023 issued in counterpart application No. 10-2019-0067959, 10 pages.
KR Notice of Patent Grant dated Dec. 19, 2023 issued in counterpart application No. 10-2019-0067959, 4 pages.

* cited by examiner

STRUCTURE FOR GROUND AND ELECTRONIC APPARATUS INCLUDING SAME

CROSS-REFERENCE TO RELATED APPLICATIONS

This application is a Bypass Continuation application of International Application No. PCT/KR2020/007253, which was filed on Jun. 4, 2020, and is based on and claims priority under 35 U.S.C. § 119 to Korean Patent Application No. 10-2019-0067959, which was filed in the Korean Intellectual Property Office on Jun. 10, 2019, the entire disclosure of each of which is incorporated herein by reference.

BACKGROUND

1. Field

The disclosure relates generally to an electronic device, and more particularly, to a structure for a ground and an electronic device including the same.

2. Description of Related Art

An electronic device may include radio frequency (RF) circuitry for transmitting a signal. The electronic device including the RF circuitry may require a stable ground design to secure electronic-magnetic interference (EMI) performance and a return current path.

In the conventional art, a slide-type electronic device has limits in stable ground designing due to two separate structures constituting the electronic device.

As such, there is a need in the art for a slidable electronic device that has an improved ground design for more stable performance of the electronic device, notwithstanding the two structures constituting the electronic device.

SUMMARY

The disclosure has been made to address at least the above-mentioned problems and/or disadvantages and to provide at least the advantages described below.

Accordingly, an aspect of the disclosure is to provide an electronic device that may secure a stable ground area and increase EMI performance by forming an electrical contact according to each slide operation, using structures configured for the slide operation.

Another aspect of the disclosure is to provide a structure for ground and an electronic device including the same, having an electrically robust design without requiring additional components, and which provides a sufficient return current path by securing a stable ground area using slide operation structures.

According to an aspect of the disclosure, an electronic device of a slide type is provided. The electronic device includes a main body, a guide rail coupled with the main body and configured to enable rotational movement, a driving device coupled with the main body and configured to control the rotational movement of the guide rail, a guide structure coupled with the main body, a slide body; and a connector structure coupled with the slide body, wherein the connector structure is coupled with the guide rail to linearly move according to the rotational movement, wherein the slide body is flexibly disposed in a designated area according to the linear movement of the connector structure, and wherein one surface of the connector structure and one surface of the guide structure are configured to form an electrical connection.

BRIEF DESCRIPTION OF THE DRAWINGS

The above and other aspects, features, and advantages of certain embodiments of the disclosure will be more apparent from the following detailed description taken in conjunction with the accompanying drawings, in which.

DETAILED DESCRIPTION

Figure 1:
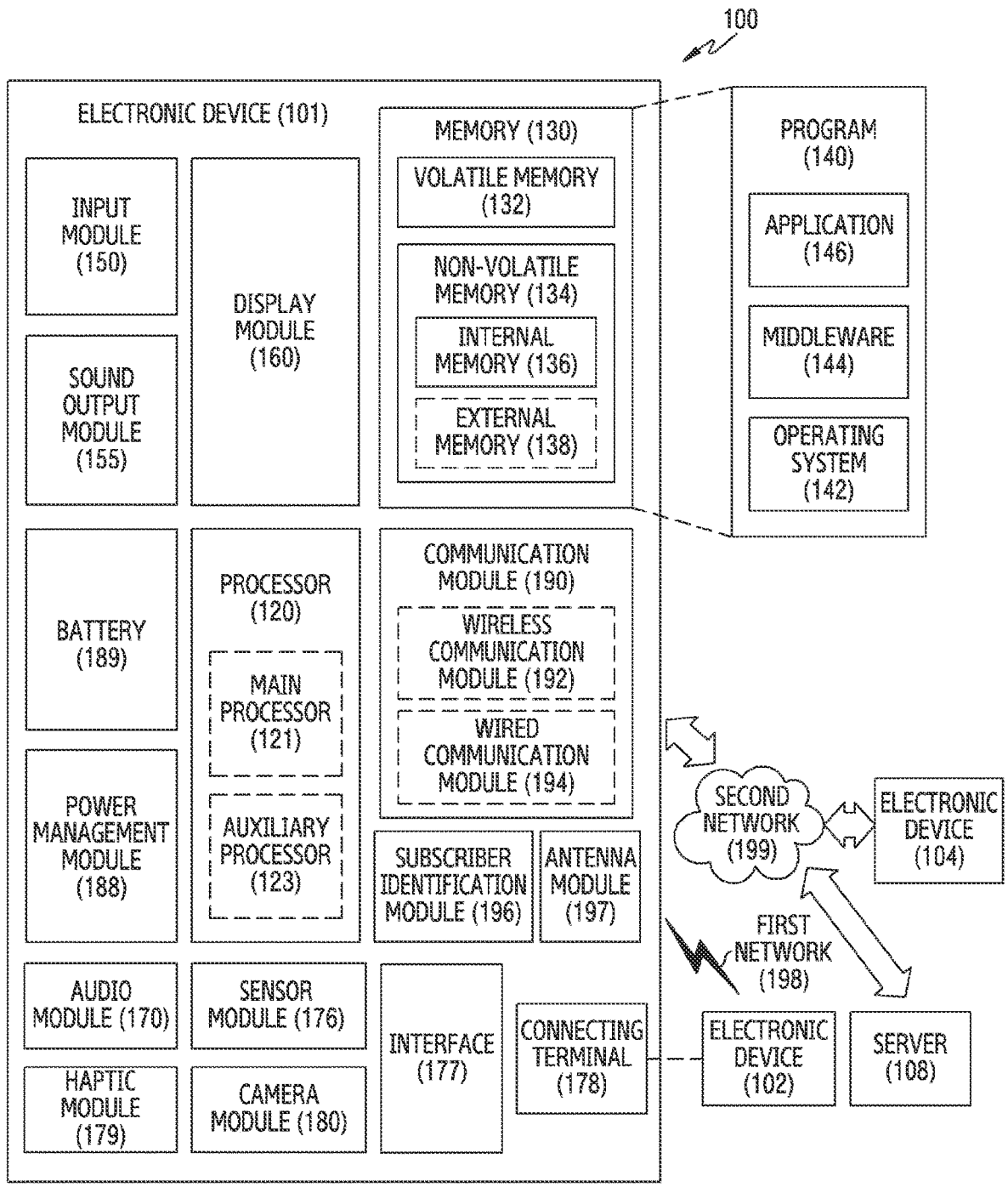
FIG. 1 illustrates an electronic device in a network environment, according to an embodiment.

Hereinafter, embodiments of this document will be described with reference to the accompanying drawings. In the disclosure, embodiments are described in the drawings and a related detailed description is set forth, but this is not intended to limit the embodiments of the disclosure. Descriptions of well-known functions and constructions are omitted for the sake of clarity and conciseness.

Terms in the disclosure are used for describing particular embodiments and are not intended to limit the scope of other embodiments. A singular form may include a plurality of forms unless it is explicitly differently represented. All the terms used herein, including technical and scientific terms, may have the same meanings as terms generally understood by those skilled in the art to which the disclosure pertains. The terms defined in a typical dictionary among terms used in the disclosure may be interpreted to have the same or similar meanings with the context of the relevant art, and, unless explicitly defined in this disclosure, it shall not be interpreted ideally or excessively as formal meanings. In some cases, even terms defined in this disclosure should not be interpreted to exclude the embodiments of the disclosure.

Herein, a hardware approach is described as an example. However, since embodiments of the disclosure include a technology using both hardware and software, the embodiments do not exclude a software-based approach.

With regard to descriptions of the drawings, similar reference numerals may be used for similar or related components.

In the disclosure, to determine whether a specific condition is fulfilled, expressions such as greater than or equal to or less than or equal to are used, but these are by way of example and do not exclude expressions such as greater than or less than. As such, a condition expressed as greater than or equal to may be replaced by greater than, a condition expressed as less than or equal to may be replaced by less than, and a condition expressed as greater than or equal to and less than may be replaced by greater than and less than or equal to.

The disclosure relates to a structure for ground and an electronic device including the same in a wireless communication system. Specifically, the disclosure describes a technique for achieving EMI performance and a return current path, by securing a stable ground area in a slide-type electronic device including a main body and a slide body.

Terms herein referring to structures of the electronic device, connection between structures, RF circuitry, circuits for ground, and general circuits such as a printed circuit board (PCB), a flexible PCB (FPCB), a signal line, and a data line, are illustrated for convenience of explanation. Accordingly, the disclosure is not limited to terms to be described, and other terms having an equivalent technical meaning may be used.

FIG. 1 illustrates an electronic device 101 in a network environment 100 according to an embodiment.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) card 196, and an antenna module 197. At least one of the components may be omitted from the electronic device 101, or one or more other components may be added in the electronic device 101. Some of the components may be implemented as single integrated circuitry. For example, the sensor module 176 may be implemented as embedded in the display device 160.

The processor 120 may execute a program 140 to control at least one other hardware or software component of the electronic device 101 coupled with the processor 120 and may perform various data processing or computation. As at least part of the data processing or computation, the processor 120 may load a command or data received from another component in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally, or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component among the components of the electronic device 101, instead of the main processor 121 while the main processor 121 is in an inactive (e.g., sleep) state, or together with the main processor 121 while the main processor 121 is in an active state. The auxiliary processor 123 may be implemented as part of another component (e.g., the camera module 180 or the communication module 190) functionally related to the auxiliary processor 123.

The memory 130 may store various data used by at least one component of the electronic device 101. The various data may include the program 140 and input data or output data for a command related thereto. The memory 130 may include the volatile memory 132 or the non-volatile memory 134.

The program 140 may be stored in the memory 130 as software and may include an operating system (OS) 142, middleware 144, or an application 146.

The input device 150 may receive a command or data to be used by another component of the electronic device 101, from a user of the electronic device 101. The input device 150 may include a microphone, a mouse, a keyboard, or a digital pen (e.g., a stylus pen).

The sound output device 155 may output sound signals to the outside of the electronic device 101. The sound output device 155 may include a speaker or a receiver. The speaker may be used for general purposes, such as playing multimedia or playing record, and the receiver may be used for an incoming call. The receiver may be implemented as separate from, or as part of the speaker.

The display device 160 may visually provide information to a user of the electronic device 101. The display device 160 may include a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150 or output the sound via the sound output device 155 or a headphone of an external electronic device 102 directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device 102 directly (e.g., wiredly) or wirelessly. The interface 177 may include a high-definition multimedia interface (HDMI), a universal serial bus (USB) interface, a secure digital (SD) card interface, or an audio interface.

A connecting terminal 178 may include a connector via which the electronic device 101 may be physically connected with the external electronic device 102. The connecting terminal 178 may include an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include a motor, a piezoelectric element, or an electric stimulator.

The camera module 180 may capture a still image or moving images. The camera module 180 may include one or more lenses, image sensors, ISPs, or flashes.

The power management module 188 may manage power supplied to the electronic device 101. The power management module 188 may be implemented as at least part of a power management integrated circuit (PMIC).

The battery 189 may supply power to at least one component of the electronic device 101. The battery 189 may include a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the AP 120 and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM card 196.

The antenna module 197 may transmit or receive a signal or power to or from the external electronic device of the electronic device 101. The antenna module 197 may include an antenna including a radiating element composed of a conductive material or a conductive pattern formed in or on a PCB. The antenna module 197 may include a plurality of antennas. In such a case, at least one antenna appropriate for a communication scheme used in the communication network, such as the first network 198 or the second network 199, may be selected by the communication module 190 from the plurality of antennas. The signal or the power may then be transmitted or received between the communication module 190 and the external electronic device via the selected at least one antenna. An RF integrated circuit (RFIC) may be additionally formed as part of the antenna module 197.

At least some of the above-described components may be coupled mutually and communicate commands or data therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request and transfer an outcome of the performing to the electronic device 101. The electronic device 101 may provide the outcome, with or without further processing of the outcome, as at least part of a reply to the request. To that end, a cloud, distributed, or client-server computing technology may be used, for example.

The electronic device 101 may be a slide-type electronic device including a fixing unit and a moving unit which performs a slide operation. Herein, the disclosure is described by referring to the fixing unit as a main body and the moving unit as a slide body for convenience of descriptions, but embodiments of the disclosure may not be limited thereto. The slide-type electronic device may be configured to move the main body and to fix an auxiliary body or may be configured to move both the two separate bodies, according to another embodiment.

EMI is electromagnetic interference referring to radiation disorder or radiation interference and indicates interference which hinders other function due to electromagnetic waves emitted from the electronic device. The EMI may refer to an unwanted signal which worsens circuitry function and causes malfunction of equipment. The EMI may include electromagnetic noise generated by radiating electromagnetic waves into the air (e.g., radiated emission (RE)) or electromagnetic noise transmitted through a medium such as a signal line (e.g., conducted emission (CE)). A return current path is for ground connection of a signal. The ground may be connected stably as many return current paths are secured, and accordingly, the EMI performance may be improved.

The slide body may include at least one of a camera module 180, RF circuitry (e.g., the communication module 190), or an antenna module 197. In this case, a PCB of the slide body may be required to connect in structure with a plurality of signal lines, and to transmit a significant amount of data to a PCB of the main body. In so doing, to secure the stable return current path for the signal delivery of the electronic device 101 and to satisfy EMI performance, stable ground connection (e.g., signal ground) may be required. For more stable ground connection, ground structures of a great volume may be required, and robust electrical connection between structures interconnecting the main body and the slide body may be also required.

Figure 2A:
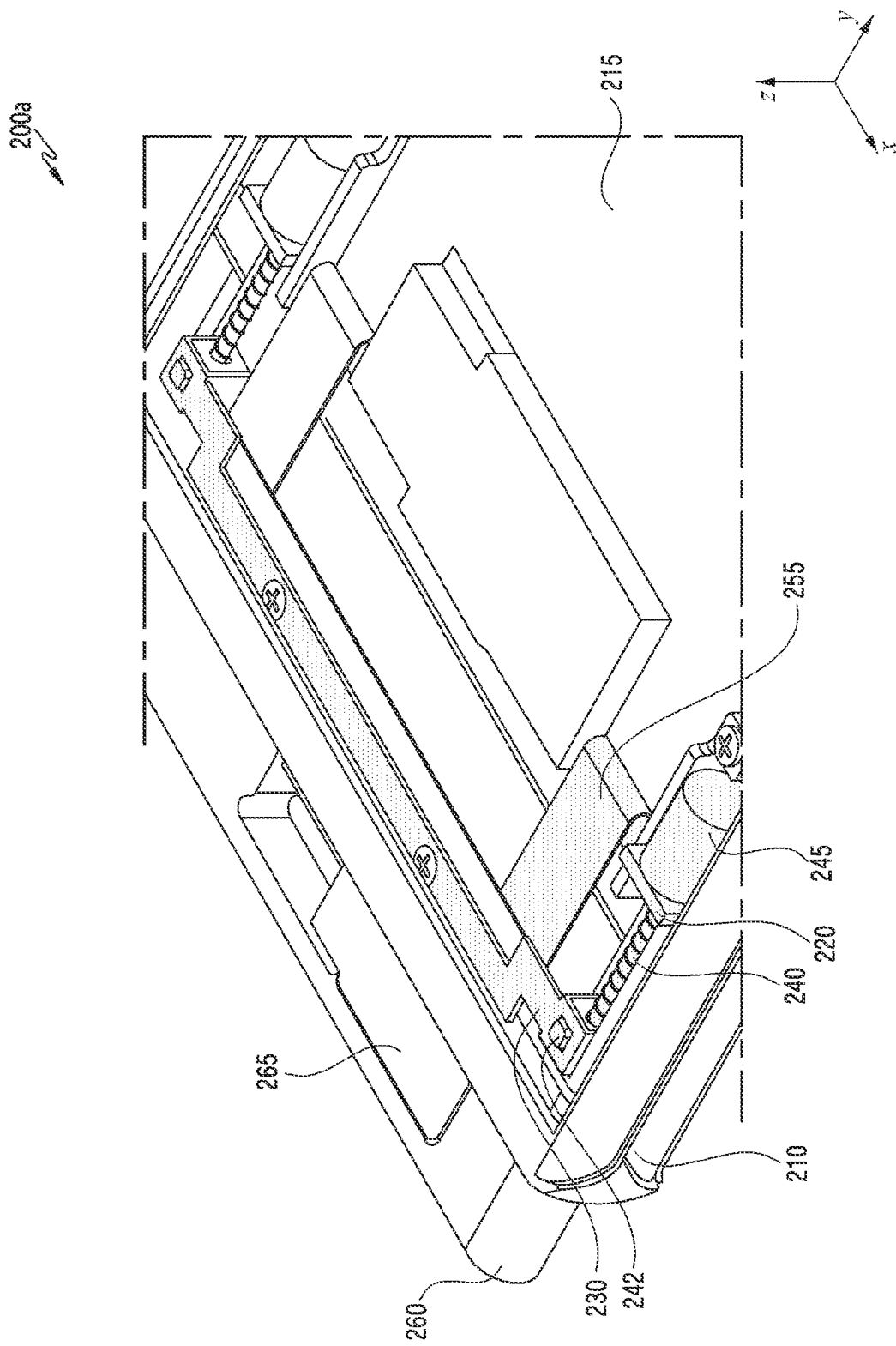
FIG. 2A illustrates an internal structure of an electronic device according to an embodiment.

The disclosure relates to a structure for stably connecting electrical ground each formed on a main body and a slide body, regardless of a slide operation, a shape and an arrangement of each structure, and an electronic device including the same. Herein FIG. 2A illustrates an internal structure of an electronic device according to an embodiment. The electronic device 101 may be a slide-type electronic device in which at least one of the separated bodies has a flexible position on a designated path.

Referring to FIG. 2A, the internal structure 200a of the electronic device may include a main body 210 having a housing. The housing forms a front surface (an xy plane, a (+)z direction), a rear surface (an xy plane, a (−)z direction), and a side surface surrounding at least part of a space between the front surface and the rear surface of the electronic device 101. For example, the housing may include a metal housing (or a metal front).

The main body 210 may include a main PCB 215 that includes elements (e.g., a resistor, a condenser, an integrated circuit (IC), etc.) for electromagnetic operations of the electronic device 101. For example, the main PCB 215 may include at least one processor and a modem.

The electronic device 101 may include a slide body 260. The slide body 260 may be disposed to at least in part overlap the main body 210, when viewed from above a plane perpendicular to the z-axis (e.g., the xy plane). The slide body 260 may be disposed to have a flexible position on a designated path based on a slide operation. The slide operation may indicate a movement of the slide body 260 along a direction provided by the main body 210, by coupling a structure of the slide body 260 and a structure of the main body 210 to allow movement (e.g., linear movement, curved movement) of the structure of the slide body 260 on an area provided by the structure of the main body 210. The slide body 260 may be positioned in the housing of the main body 210 or disposed to protrude outwards. If the slide body 260 is positioned inside the housing of the main body 210, the slide body 260 may form the housing of the main body 210 when viewed from one side.

The slide body 260 may include a subsidiary PCB (sub-PCB) 265. The sub-PCB may include elements (e.g., a resistor, a condenser, an IC, etc.) for the electromagnetic operations of the electronic device 101. The sub-PCB 265 may include an antenna module for communication. The sub-PCB 265 may include an RF module and a camera module 180.

The electronic device 101 may include structures for performing the slide operation, in which the slide body 260 moves along a slide path provided by the main body 210. The structures for performing the slide operation may include structures of the slide body 260 for the movement of the slide body 260 and structures of the main body 210 for providing the movement or the slide path of the slide body 260, and the structures are referred to herein as a slide structure.

The slide structure may include a guide structure 220. The guide structure 220 guides the slide operation of the slide body 260 and may be connected and secured to the housing of the main body 210. A designated path of the slide body 260 may be defined, based on a guide area (or a guide path) provided by the guide structure 220.

The slide structure may include a connector structure 230 for transmitting momentum for the slide operation to the slide body 260 and may be physically connected with the slide body 260. The connector structure 230 may transmit the momentum of the slide structure disposed on the main body 210 to the slide body 260.

The slide structure may include a guide rail 240 disposed at least in part inside the guide structure 220. The guide rail 240 may be coupled with the connector structure 230, to provide movement of the guide rail 240 to the connector structure 230. The connector structure 230 and the guide rail 240 may be coupled through a fixing body 242 for assisting the coupling between the two structures. The fixing body 242 is inserted between a hole of the connector structure 230 and a shaft of the guide rail 240, to connect the connector structure 230 and the guide rail 240 and to secure the connection. The guide rail 240 and the fixing body 242 may correspond to a relationship between a bolt and a nut.

Due to the coupling between the connector structure 230 and the guide rail 240, the movement (e.g., rotational movement) of the guide rail 240 may be transmitted to the connector structure 230 through the fixing body 242. According to the rotation of the guide rail 240, the fixing body 242 may move along the guide rail 240 with the connector structure 230 on the guide area. For example, if the guide rail 240 rotates clockwise, the connector structure 230 and the fixing body 242 coupled with the guide rail 240 may move in the (−)y-axis direction. If the guide rail 240 rotates counterclockwise, the connector structure 230 and the fixing body 242 coupled with the guide rail 240 may move in the (+)y-axis direction. That is, the connector structure 230 and the fixing body 242 may be disposed together to allow the linear movement in the y-axis direction in response to the rotational movement of the guide rail 240.

The guide structure 220 may be coupled with a driving device 245 which controls the slide operation. The driving device 245 may be mechanically coupled to the main body 210. The driving device 245 may include an actuator which controls (e.g., rotates) the guide rail 240. The fixing body 242 may have a flexible arrangement according to the linear movement on the direction (i.e., the y-axis direction) of the guide rail 240 under the control of the driving device 245. Herein, the movement of the slide body 260 in the (−)y-axis direction may be referred to as a slide-up operation, and the movement in the (+)y-axis direction may be referred to as a slide-down operation.

Due to the slide operation of the slide body 260, a relative position of the sub-PCB 265 with respect to the main PCB 215 may be changed, and this change may cause unstable ground connection between the sub-PCB 265 and the main PCB 215. Hence, the slide-type electronic device 101 may be required to secure a return current path and to satisfy EMI performance. The disclosure may provide stable ground connection for the sub-PCB 265 and the main PCB 215, through a structure which establishes electrical connection (e.g., DC contact or alternating current (AC) coupling)

between the guide structure 220 and the connector structure 230. The disclosure does not exclude other configurations for electrically connecting the sub-PCB 265 and the main PCB 215. The electronic device 101 may further include a flexible PCB (FPCB) 255 for connecting the main PCB 215 and the sub-PCB 265. The electronic device 101 may further include a contact structure (e.g., a C-clip) for connecting a contact portion of the main body 210 and the sub-PCB 265. The contact portion of the main body 210 may be electrically connected with the main PCB 215.

Figure 2B:
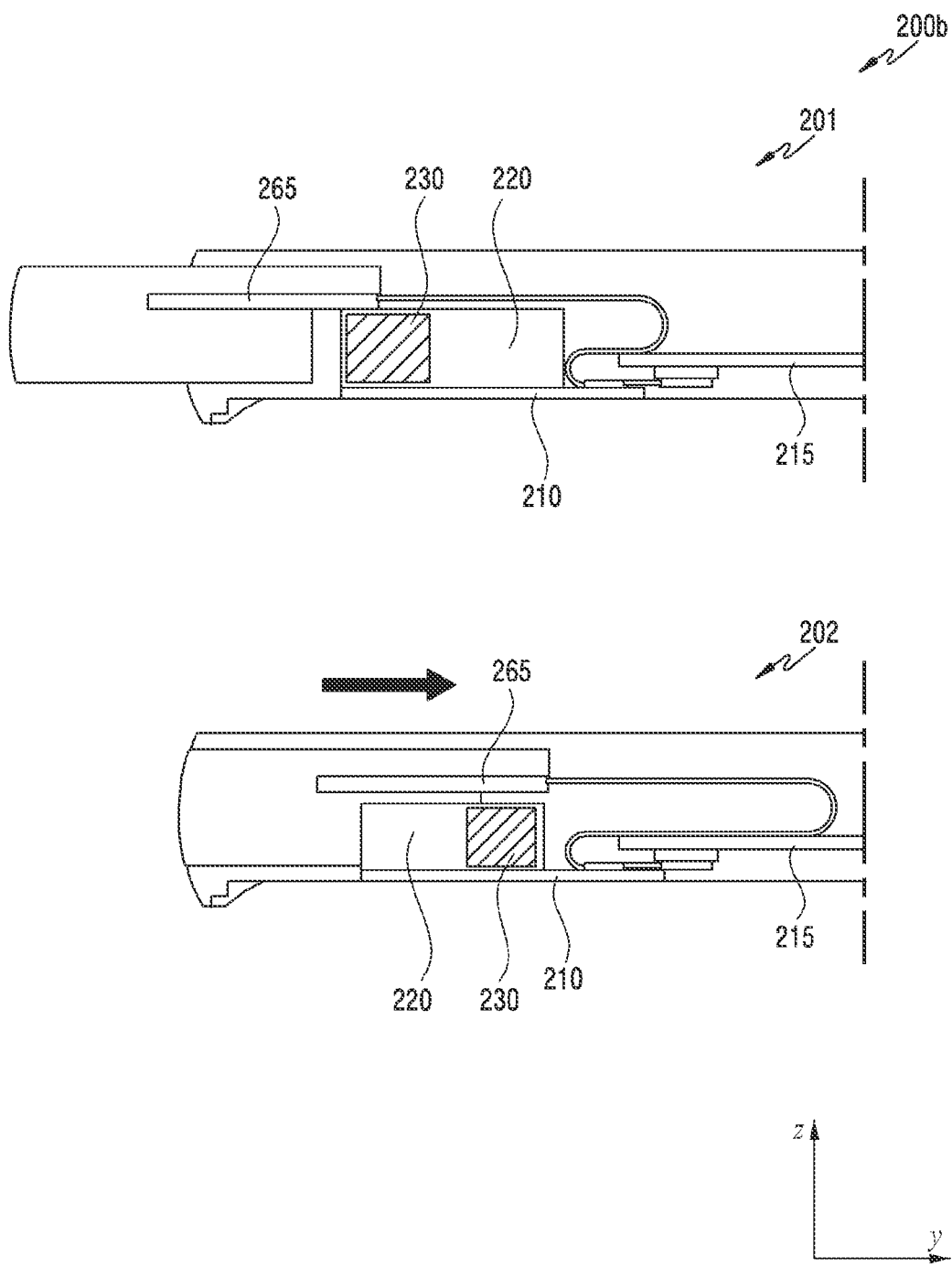
FIG. 2B illustrates a cross section of an internal structure of an electronic device according to an embodiment.

FIG. 2B illustrates a cross-section of an internal structure of the electronic device according to an embodiment. The internal structure in FIG. 2B corresponds to the internal structure 200a of FIG. 2A and accordingly, descriptions on the same configuration may be omitted. The cross section 200b of FIG. 2B indicates a surface of the electronic device 101 in FIG. 2A taken along a plane perpendicular to the x-axis (e.g., the yz plane of FIG. 2A).

Referring to FIG. 2B, the slide body 260 of the electronic device 101 may be flexibly disposed on the x-axis according to the slide operation. A first state 201 is when the slide body 260 protrudes from the main body 210 (e.g., a slide-up state), and a second state 202 is when the slide body 260 is received in the main body 210 (e.g., a slide-down state). To transition from the first state 201 to the second state 202, the slide body 260 may be moved in the (+)y-axis direction. To transition from the second state 202 to the first state 201, the slide body 260 may be moved in the (−)y-axis direction.

The electronic device may electrically connect the guide structure 220 and the connector structure 230 to electrically connect the main PCB 215 and the sub-PCB 265. According to the movement of the slide body 260, the guide structure 220 and the connector structure 230 may be flexibly disposed on the guide path. To maintain the electrical connection between the main PCB 215 and the sub-PCB 265 notwithstanding the flexible arrangement, the electronic device 101 may include a ground connector structure which maintains the electrical connection between the guide structure 220 and the connector structure 230 in the first state 201, the second state 202, and a third state which is in the slide movement. The ground connector structure may include a DC contact structure or an AC coupling structure.

Figure 3:
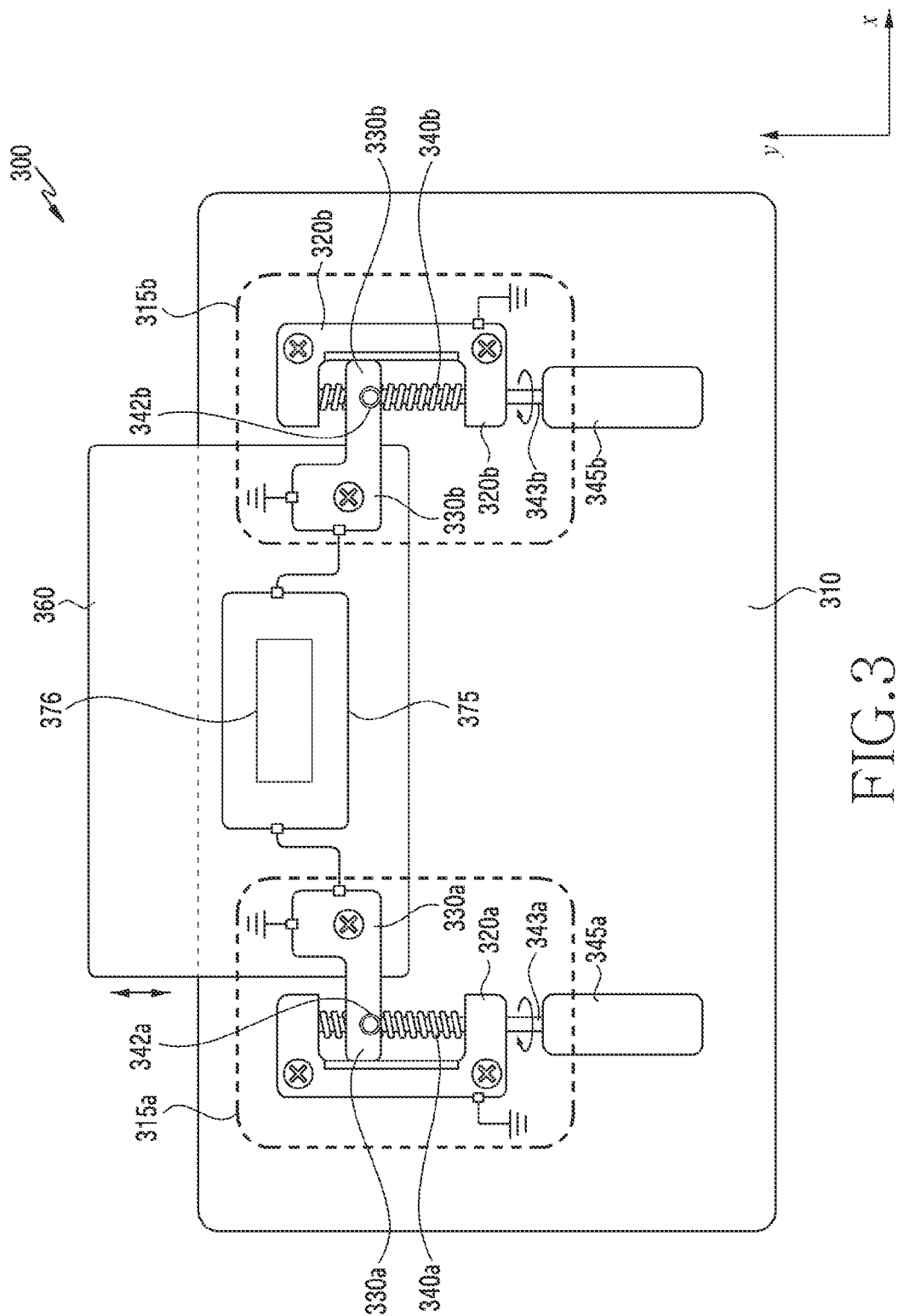
FIG. 3 illustrates an electronic device for electrical connection between slide structures according to an embodiment.

FIG. 3 illustrates an electronic device for electrical connection between slide structures according to an embodiment.

Referring to FIG. 3, the electronic device 300 may include a main body 310 and a slide body 360.

The electronic device may include a dual slide structure for stable slide connection between the main body 310 and the slide body 360. The dual slide structure may include two slide structures for the slide operation. The electronic device may include, as the dual slide structure, a first slide structure 315a positioned at one end (e.g., a (−)x direction end of FIG. 3) of the electronic device and a second slide structure 315b positioned at the other end (e.g., an x-direction end of FIG. 3) of the electronic device 101. The slide structures 315a and 315b may include a structure connected to the main body 310 and a structure connected to the slide body 360 mechanically coupled for the slide operation.

The main body 310 may include a first guide structure 320a and a second guide structure 320b for the stable slide connection. The first guide structure 320a and the second guide structure 320b may be included and disposed in a housing of the main body 310 and may be electrically connected to ground of a main PCB of the main body 310. The first slide structure 315a may include the first guide structure 320a. The second slide structure 315b may include the second guide structure 320b.

The slide body 360 may include a first connector structure 330a and a second connector structure 330b for the stable slide connection. The first slide structure 315a may include the first connector structure 330a. The second slide structure 315b may include the second connector structure 330b. The slide body 360 may include a sub-PCB 375. The sub-PCB 375 may include RF communication circuitry 376. The RF communication circuitry 376 may be connected to an antenna through the sub-PCB 375. The RF communication circuitry 376 may include an RFIC and may be referred to as an RF-antenna (RF-A) module.

The electronic device may include the first slide structure 315a and the second slide structure 315b, as the structure for the slide operation of the slide body 360 on an area guided by the main body 310. Each slide structure may include electrical connection as well as the mechanical connection for the slide operation. Herein, the connection between the structures are described based on the first slide structure 315a, but the embodiments may be applied to the second slide structure 315b in the same or similar manner.

The first guide structure 320a may be electrically connected to the first connector structure 330a. The first guide structure 320a may be connected to the first connector structure 330a in the DC contact manner. Alternatively, the first guide structure 320a may be connected to the first connector structure 330a in the AC coupling manner. A recessed space may be formed in the first guide structure 320a corresponding to the y-axis direction such that the first connector structure 330a has a flexible arrangement in the y-axis direction. The space may be referred to as a guide area. The first guide structure 320a may include a plurality of surfaces forming the guide area. The first guide structure 320a may include a first guide rail 340a in the guide area. The first guide rail 340a may be coupled with a first driving device 345a through the first driving device 345a and a first shaft 343a.

Under the control of the first driving device 345a, the first guide rail 340a may provide the slide operation to the first connector structure 330a. Specifically, the first driving device 345a may control the first guide rail 340a to rotate. According to the rotational movement of the first guide rail 340a, a fixing body 342a connected to the first guide rail 340a may perform linear movement in the y-axis direction. According to the movement of the fixing body 342a, the first connector structure 330a connected to the structure may also perform linear movement in the same direction.

The first connector structure 330a may be electrically connected to the first guide structure 320a to connect the sub-PCB 375 of the slide body 360 to a main PCB of the main body 310 and to secure a ground path of the sub-PCB 375. For electrical connection, the first connector structure 330a may include a conductive member. The first connector structure 330a may be connected in the DC manner due to the physical contact with the first guide structure 320a. The first connector structure 330a may be disposed such that one surface forming the guide area of the first guide structure 320a and one surface of the first connector structure 330a form capacitance. Through the closely arranged structure, the first connector structure 330a and the first guide structure 320a may be electrically connected.

As described above, the electronic device 101 may have the dual slide structure. Hence, the functions, the operations, and the arrangements of the first slide structure 315a, the first guide structure 320a, the first connector structure 330a, the first guide rail 340a, the first fixing body 342a, the first shaft 343a, and the first driving device 345a may be applied to the second slide structure 315b, the second guide structure 320b, the second connector structure 330b, the second guide rail 340b, the second fixing body 342b, the second shaft 343b, and the second driving device 345b identically or as modified by one skilled in the art. The electronic device may have a structure in which the electrical connection between the two slide structures is formed in a different manner. The electronic device 101 in the slide-up state may include slide structures disposed to DC-contact the first connector structure 330a with the first guide structure 320a, and to AC-couple the second connector structure 330b with second guide structure 320b.

Herein, the connector structure and the guide structure may be electrically connected through at least one of a direct connector structure (a contact structure) or a coupling structure. The contact structure is a connection for transmitting a signal between two conductors, by directly contacting the two conductors, and may provide the DC-type electrical connection. The coupling structure may provide an electrical connection for delivering AC signal energy electrically or magnetically between separate spaces or lines, by forming capacitance to pass an AC component of the signal. The capacitance may affect performance of the AC coupling.

Figure 4A:
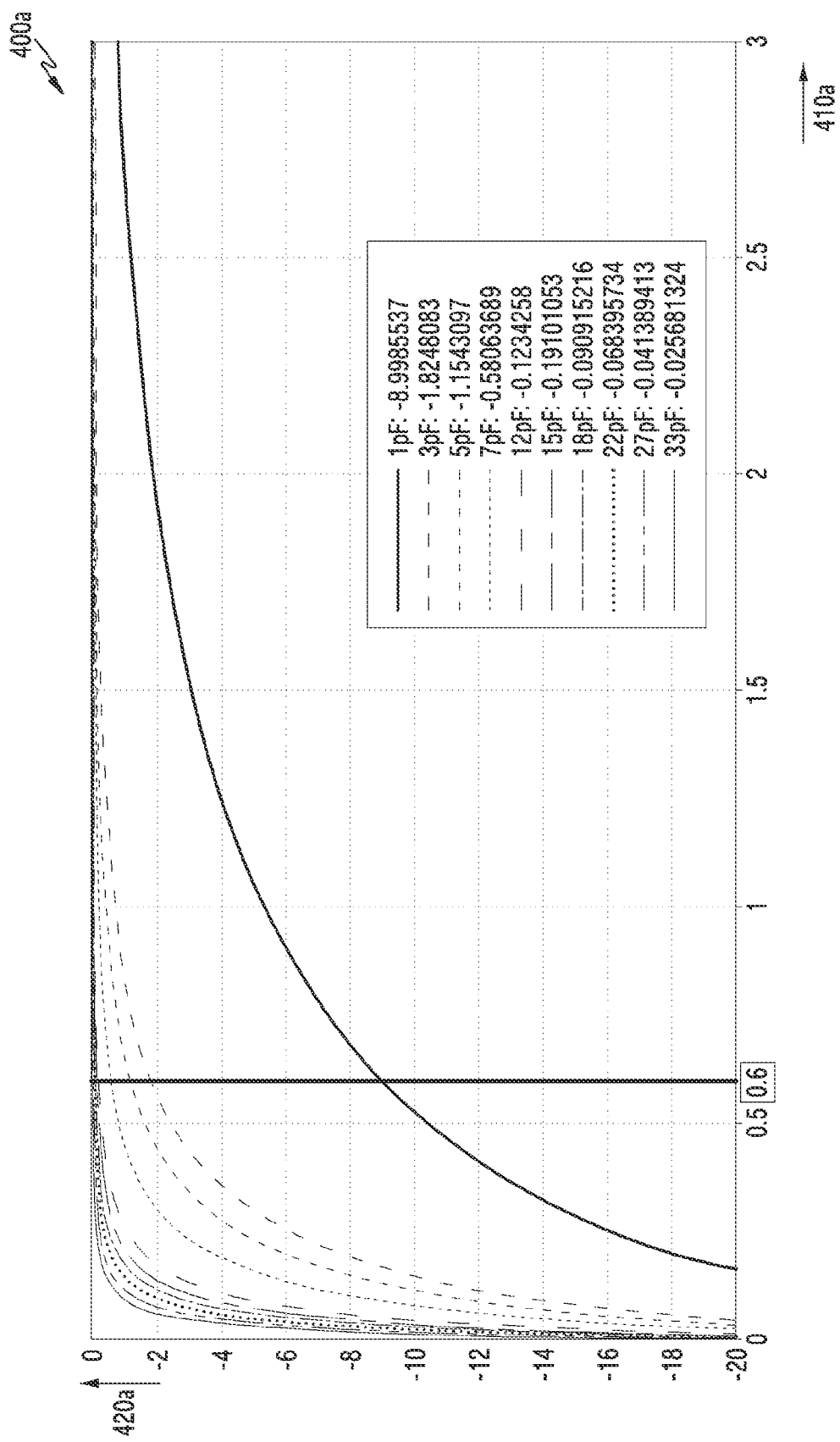
FIG. 4A and FIG. 4B illustrate graphs presenting capacitance for electrical connection according to an embodiment.
Figure 4B:
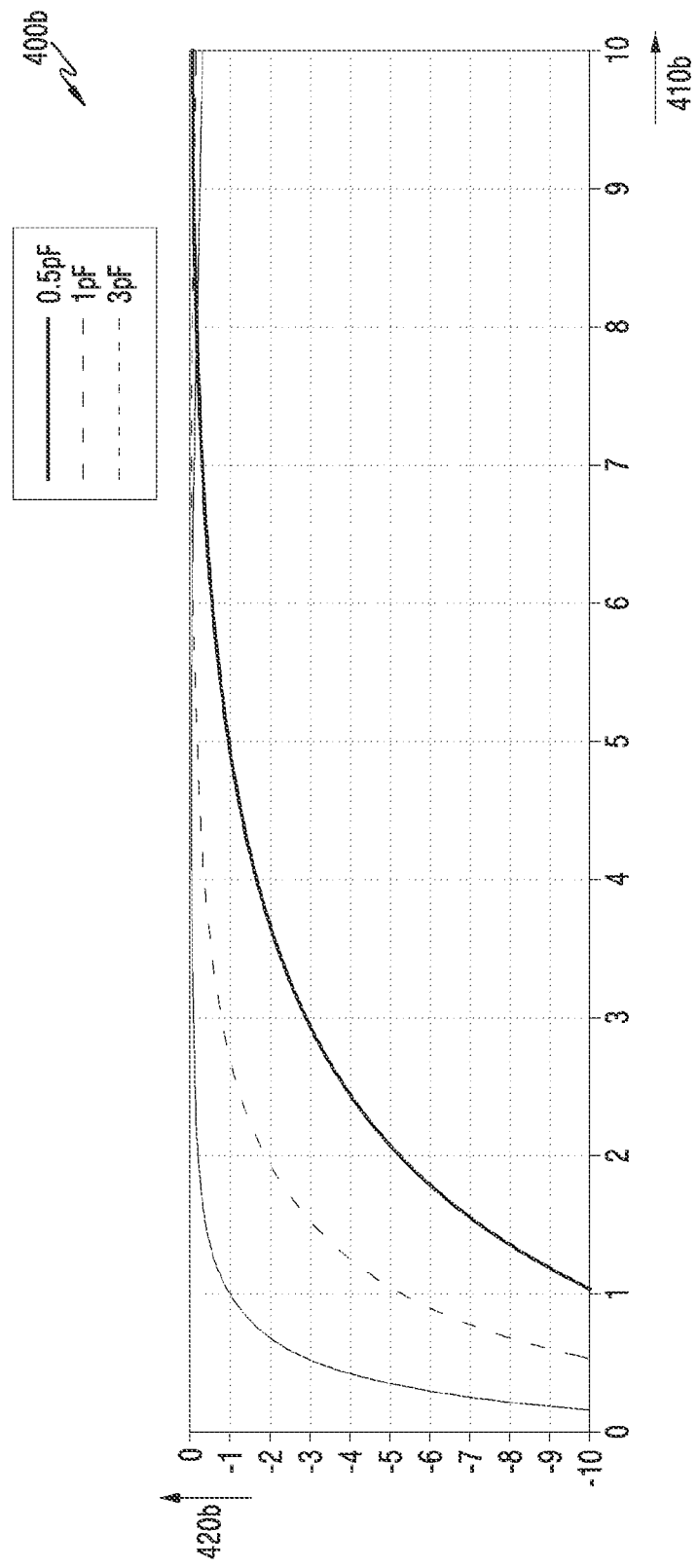

FIG. 4A and FIG. 4B illustrate graphs presenting capacitance for electrical connection according to various embodiments. Graph 400a in FIG. 4A and graph 400b in FIG. 4B illustrate a capacitance value related to AC coupling connection between a guide structure 220 and a connector structure 230 which are the slide structures.

Referring to FIG. 4A, graph 400a shows a relationship between the frequency and scattering (S)-parameters. The S-parameter may indicate a ratio of an input voltage to an output voltage in the frequency domain. A horizontal axis 410a represents the frequency in gigahertz (GHz), and a vertical axis 420a represents the S-parameter in decibels (dB). If comparing performance values based on each capacitor at the same frequency of graph 400a, it may be required to have the capacitance value greater than or equal to a reference value, to achieve the performance over a specific level. For example, coupling circuitry formed due to the coupling between the slide structures may be required to provide the capacitance over 5 picofarads (pF) at 1.8 GHz. The higher the capacitance, the higher the coupling performance of the coupling circuitry becomes.

Referring to FIG. 4B, graph 400b shows the relationship between the frequency and the S-parameters. Graph 400b shows the coupling performance in the frequency domain higher than that of graph 400a. A horizontal axis 410b represents the frequency (GHz), and a vertical axis 420b represents the S-parameters (dB). If comparing performance values according to each capacitor even in the high frequency range (e.g., 6 GHz or higher), it may be required to have the capacitance value greater than or equal to the reference value, to achieve the performance over a specific level. For example, the coupling circuitry may be required to provide the capacitance over about 1 pF at 10 GHz.

The AC coupling of the electronic device indicates a scheme of electrically connecting two structures by forming capacitance through a surface of the connector structure and a surface of the guide structure. Each surface may include a conductor to form the capacitance. One surface of the structure may include the conductor on a surface facing one surface of the other structure. It may be difficult to achieve sufficient capacitance capacity required for the AC coupling merely with the surfaces of the structure and an air gap. To increase the capacitance capacity, the electronic device 101 may include a structure which disposes a dielectric (an insulator) between one surface of the guide structure (i.e., a first conductor) and one surface of the connector structure (i.e., a second conductor).

The electronic device 101 may include an insulation layer disposed between the surface of the first conductor and the surface of the second conductor. By disposing the insulation layer, the capacitance may be formed in a structure of conductor-insulator-conductor. A shape of the dielectric included in the insulation layer may include at least one of powder, fiber, rod, flake, film, sheet, colloid, and sol. The insulation layer may include a polyimide (PI) film.

The electronic device 101 may include a guide structure in which at least one surface of the first conductor is non-conductively coated, or a connector structure in which at least one surface of the second conductor is non-conductively coated. The nonconductive coating may include anodizing coating. Due to the anodizing coating, a dielectric film may be formed between the surfaces of the two conductors. In the slide structure, the capacitance may be formed in a stacked structure constituted by the first conductor, a nonconductive coating (e.g., anodizing), an air gap, a nonconductive coating (e.g., anodizing), and a conductor (e.g., the second conductor). The stacked structure may be a structure in which an air gap is formed between the anodized-coated first conductor and the anodized-coated second conductor. By including a separate dielectric in the slide structure, an additional dielectric may be replaced instead of the air gap of the structure.

As described above, the gap between the slide structures (i.e., the surface of the guide structure and the surface of the slide structure) may be reduced through the insulation layer or the nonconductive coating processing, thereby increasing the capacitance.

Table 1 below shows capacitance according to each of the insulation layer including the PI film, the anodizing coating, and the air gap type.

TABLE 1

| | X (in millimeters) (mm) | Y (mm) | Area (mm$^2$) | Gap (in micrometers) (μm) | permittivity | capacitance (Pf) |
|---|---|---|---|---|---|---|
| insulation layer (PI film) | 3 | 3 | 9 | 20 | 3.5 | 13.9 |
| anodizing coating | 3 | 3 | 9 | 9 | 3.7 | 32.8 |
| air gap | 5 | 10 | 50 | 100 | 1 | 4.4 |

Referring to Table 1, it may be identified that even if the area reduces, the connector structure providing high capacitance is formed due to the decrease of the gap and the high permittivity. The decreases of the area and the gap may secure a margin space of the electronic device 101, thereby enabling circuitry design for an additional function.

A state of an electronic device 101 according to a slide operation of the disclosure may be defined as three states including a first state, a second state, and a third state. The first state 201 indicates when the slide body 260 overlaps the main body 210 in the least area, when viewed from above one surface of the electronic device (e.g., the xy plane), and may be referred to as a slide-up state. The second state 202 indicates when the slide body 260 overlaps the greatest area from the main body 210, when viewed from above one surface of the electronic device and may be referred to as a slide-down state. The third state is an intermediate state of the slide operation moving from the first state to the second state or from the second state to the first state and may be referred to as a slide-move state.

The electronic device suggests an arrangement, a shape, and an operating mechanism of each slide structure to support stable electrical connection between two structures regardless of the slide operation.

Figure 5:
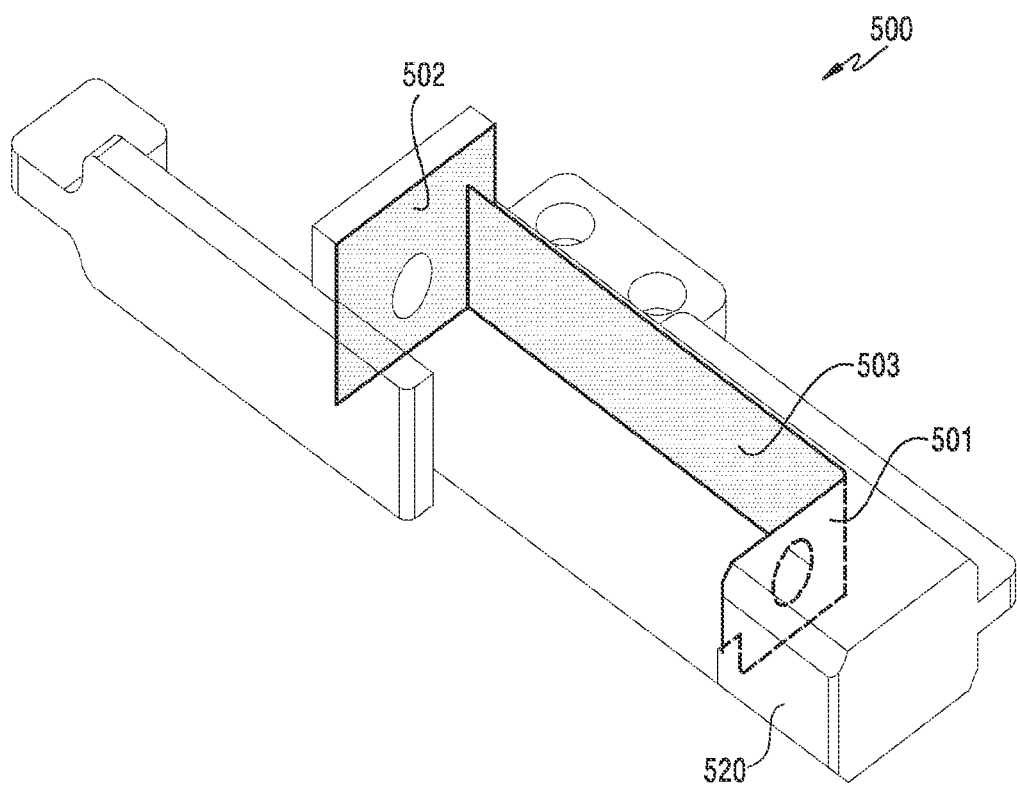
FIG. 5 illustrates a guide structure according to an embodiment.

FIG. 5 illustrates a guide structure according to an embodiment. The guide structure 520 is for guiding the slide operation of the slide body and may be disposed to connect a main body 210, 310 or a main PCB 215. The guide structure 520 relates to the guide structure 220, the first guide structure 320a, or the second guide structure 320b.

Referring to the illustration 500 in FIG. 5, the guide structure 520 may include a guide unit in the form including the plurality of the surfaces. A guide area may be formed through the plurality of the surfaces of the guide unit for guiding the slide operation of the slide body 260 of the electronic device 101. The guide area indicates an area for flexibly disposing a part of a fixing body 242 connected to a connector structure 230. Each surface of the guide structure 520 may be referred to as a guide surface.

The plurality of the surfaces of the guide structure 520 may include a first surface 501, a second surface 502, and a third surface 503. The first surface 501 forms electrical connection with the connector structure in the first state (i.e., the slide-up state) of the electronic device 101. The second surface 502 forms electrical connection with the connector structure in the second state (i.e., the slide-down state) of the electronic device 101. The third surface 503 forms electrical connection with the connector structure in the third state (i.e., the slide-move state) of the electronic device 101.

The plurality of the surfaces of the guide structure 520 may correspond to faces of a hexahedron. Referring to the xyz coordinate system shown in FIG. 5, the first surface 501 may be a surface parallel to the xz plane. The second surface 502 may be a surface parallel to the xz plane. The shape of the guide structure 520 may refer to when the first surface 501 and the second surface 502 face each other at the end of the guide area. The third surface 503 may be a surface parallel to the yz plane.

The guide structure 520 may be electrically connected to the connector structure according to the slide direction. The guide structure 520 may be disposed to have a surface contacting the surface of the connector structure in the DC manner or may be disposed to have a surface forming the capacitance with the surface of the connector structure in the AC manner.

Figure 6:
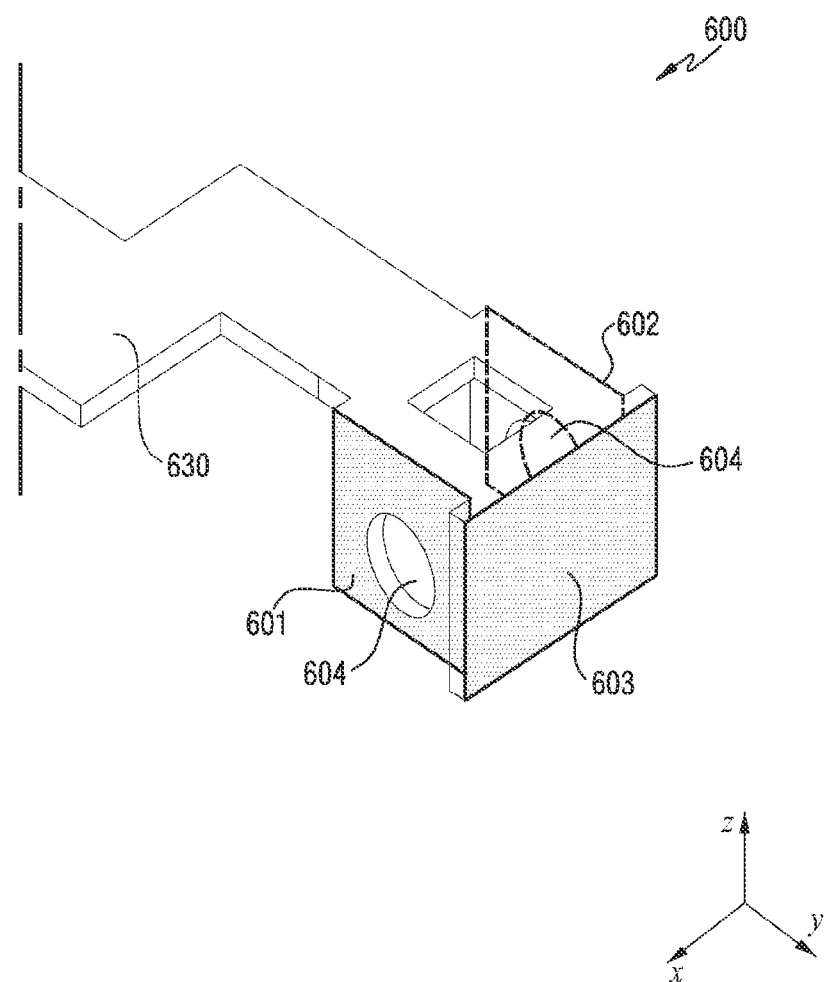
FIG. 6 illustrates a connector structure according to an embodiment.

FIG. 6 illustrates a connector structure 630 according to an embodiment. The connector structure 630 may be coupled to a slide body to transmit momentum transmitted from a structure of a main body to the slide body. In this manner, the slide body may slide and linearly move. The connector structure 630 relates to the connector structure 230, the first connector structure 330a, or the second connector structure 330b.

Referring to the illustration 600 in FIG. 6, the connector structure 630 may include a bonding unit in a form including the plurality of the surfaces. The bonding unit may provide electrical connection between the main body 210 and the slide body 260, for the slide operation. Through the structure physically fastened to a guide structure 220 of the main body and a guide rail 240, the bonding unit may transfer energy generated by the movement generated in the slide body to the main body or transfer kinetic energy according to the rotational movement of the guide rail 240 generated in the main body to the slide body.

The bonding unit may be bonding surfaces of the connector structure 630. The bonding unit may be disposed in connection with a fixing body 242 to linearly move the connector structure 630 according to the linear movement of the fixing body. The bonding unit may include a hole 604 on each of two symmetrical surfaces through which the guide rail 240 passes. Each surface of the connector structure 630 may be referred to as a bonding surface.

The plurality of the surfaces of the bonding unit may include a first surface 601, a second surface 602, and a third surface 603. The first surface 601 forms electrical connection with the guide structure in the first state (i.e., the slide-up state) of the electronic device 101. The second surface 602 forms electrical connection with the guide structure in the second state (i.e., the slide-down state) of the electronic device. The third surface 603 forms electrical connection with the guide structure in the third state (i.e., the slide-move state) of the electronic device 101.

The plurality of the surfaces of the bonding unit may correspond to faces on a hexahedron. Referring to the xyz coordinate system shown in FIG. 6, the first surface 601 may be a surface parallel to the yz plane. The second surface 602 may be a surface parallel to the yz plane. The connector structure 630 may have a shape in which the first surface 601 and the second surface 602 face each other. The third surface 603 may be a surface parallel to the xz plane.

The connector structure 630 may be electrically connected to the guide structure according to the slide direction. The connector structure 630 may be disposed to have a surface contacting the surface of the guide structure in the DC manner or may be disposed to have a surface forming capacitance with the surface of the guide structure in the AC manner.

Figure 7:
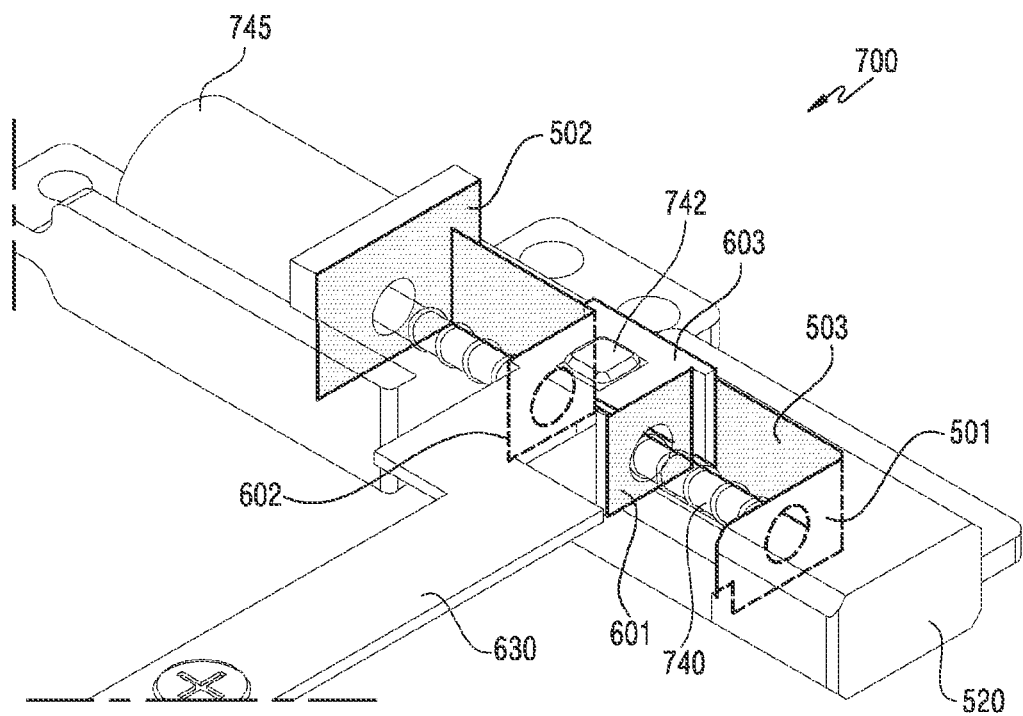
FIG. 7 illustrates a connection between slide structures according to an embodiment.

FIG. 7 illustrates a connection between slide structures according to an embodiment. The slide structures may include the guide structure 520 of FIG. 5 and the connector structure 630 of FIG. 6. The slide structures may include a fixing body 742 for interconnecting the two structures, a guide rail 740 for sliding operation of the two connected structures, and a driving device 745.

Referring to the illustration 700 in FIG. 7, the guide structure 520 may include the guide area formed with the first surface 501 for the slide-up state, the second surface 502 for the slide-down state, and the third surface 503 for the slide-move state. The connector structure 630 includes the bonding unit formed with the first surface 601 for the slide-up state, the second surface 602 for the slide-down state, and the third surface 603 for the slide-move state.

In the slide-up state, the electronic device 101 may include a slide assembly disposed to electrically connect the first surface 501 of the guide structure 520 and the first surface 601 of the connector structure 630. The first surface 501 of the guide structure 520 and the first surface 601 of the connector structure 630 may physically contact to be connected in the DC manner. Alternatively, the first surface 501 of the guide structure 520 and the first surface 601 of the connector structure 630 may be disposed apart within a specific distance range to be electrically connected in the AC manner. A dielectric (or an insulator) may be disposed within the specific distance range. A dielectric layer processed with the nonconductive coating may be disposed on at least one of the surfaces.

In the slide-down state, the electronic device may include the slide assembly in which the second surface 502 of the guide structure 520 and the second surface 602 of the connector structure 630 are electrically connected. The second surface 501 of the guide structure 520 and the second surface 602 of the connector structure 630 may physically contact to be connected in the DC manner. The second surface 502 of the guide structure 520 and the second surface 602 of the connector structure 630 may be disposed apart within a specific distance range to be electrically connected in the AC manner. A dielectric (or an insulator) may be disposed within the specific distance range. A dielectric layer processed with the nonconductive coating may be disposed on at least one of the surfaces.

In the slide-move state, the electronic device may include the slide assembly in which the third surface 503 of the guide structure 520 and the third surface 603 of the connector structure 630 are electrically connected. The third surface 503 of the guide structure 520 and the third surface 603 of the connector structure 630 may be disposed apart within a specific distance range to be connected in the AC manner. A dielectric (or an insulator) may be disposed within the specific distance range. A dielectric layer processed with the nonconductive coating may be disposed on at least one of the surfaces.

An electronic device herein may include a guide structure and a connector structure disposed to form capacitance through a conductive plate of two surfaces each and a dielectric (e.g., air) disposed between the two surfaces for the AC-type electrical connection between a main body and a slide body.

Figure 8:
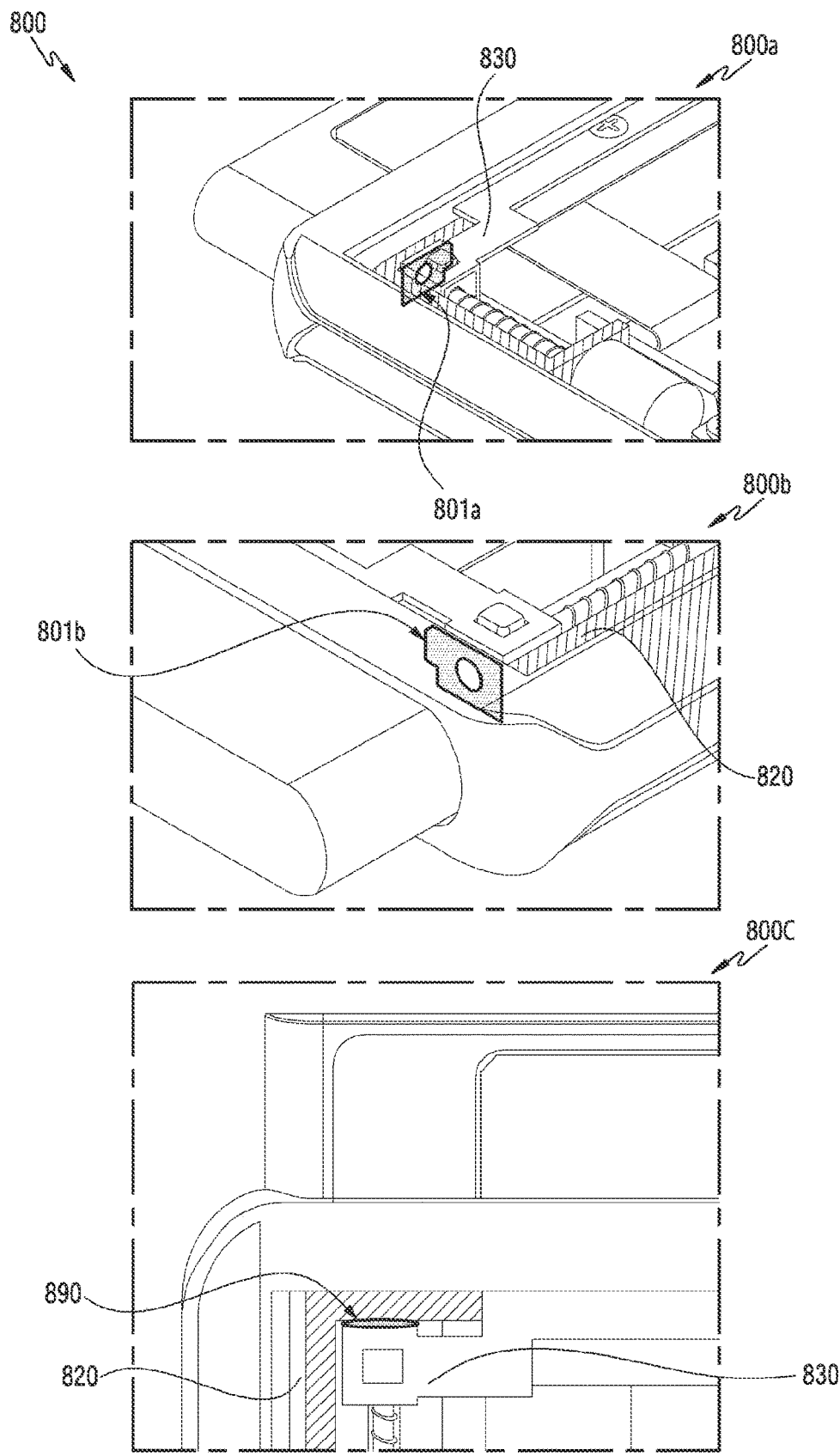
FIG. 8 illustrates an electrical connection between slide structures for a first state, according to an embodiment.

FIG. 8 illustrates an electrical connection between slide structures for a first state, according to an embodiment. In the illustration 800 in FIG. 8, the first state may be the slide-up state in which the slide body may overlap the main body in the least amount of area. The slide body may protrude from the housing of the main body. The slide structures may include a guide structure 820 physically connected to the main body and a connector structure 830 physically connected to the slide body.

Referring to a first perspective view 800a, the connector structure 830 may include a bonding unit including a first surface 801a. The connector structure 830 may have a shape including the first surface 801a to electrical connect with a first surface 801b of the guide structure 820 in the first state. Referring to a second perspective view 800b, the guide structure 820 may include a guide area including the first surface 801b. The guide structure 820 may have a shape including the first surface 801b to electrically connect with the first surface 801a of the connector structure 830 in the first state. The first surface 801a of the connector structure 830 and the first surface 801b of the guide structure 820 may be perpendicular to the slide movement direction.

Referring to a front view 800c, electrical connection 890 may be formed through the first surface 801a of the connector structure 830 and the first surface 801b of the guide structure 820. A conductor of the first surface 801a of the connector structure 830 and a conductor of the first surface 801b of the guide structure 820 face each other and may be disposed to form capacitance. The capacitance may be determined based on Equation (1), as follows.

$$C = \varepsilon \frac{A}{d} \tag{1}$$

In Equation (1), C denotes the capacitance, e denotes the permittivity between the two conductors, A denotes an area of the conductor, and d denotes a distance between the two conductors. The area of the conductor may indicate an overlapping area between the two conductors in one direction.

In Equation (1), ε, A, and d are determined depending on physical parameters between the conductor of the first surface 801a of the connector structure 830 and the conductor of the first surface 801b of the guide structure 820, and gap design for efficient arrangement of the two structures may be considered.

The electronic device 101 may include an arrangement structure in which the conductor of the first surface 801a of the connector structure 830 and the conductor of the first surface 801b of the guide structure 820 are spaced apart in a specific range to form the capacitor. The guide structure 820 and the connector structure 830 may be disposed according to a separation distance determined based on the permittivity. The permittivity may affect the capacitance. A dielectric may be disposed between the conductor of the first surface 801a of the connector structure 830 and the first surface 801b of the guide structure 820. Since the permittivity between the two structures is determined based on the disposed dielectric, the guide structure 820 and the connector structure 830 may be disposed according to the separation distance determined based on the dielectric. The dielectric may be configured in various fashions, such as by an insulation layer, a film formed by the anodizing coating processing, or air with the permittivity of 1.

The guide structure 820 and the connector structure 830 may be disposed according to the separation distance determined based on the area of each conductor, since the area of the conductor for providing the same capacitance is inversely proportional to the separation distance. As the overlapping area between the two conductors which form the capacitor increases, a narrower separation distance may be obtained. As the separation distance decreases, a length of the slide assembly corresponding to the slide movement direction for the slide operation may decrease. Conversely, as the overlapping area between the two conductors decreases, a longer separation distance may be obtained. The electronic device 101 may include the guide structure 820 and the connector structure 830 disposed in consideration of the trade-off between the separation distance and the conductor area.

The guide structure 820 and the connector structure 830 may be disposed according to the separation distance determined based on an operating frequency, since the range of the capacitance required for sufficient coupling performance is determined based on the operating frequency of the RF signal, as described in FIG. 4A and FIG. 4B.

As the capacitance is formed, the connector structure 830 and the guide structure 820 may be coupled in the AC manner. The arrangement of the connector structure 830 and the guide structure 820 may include equivalent circuitry including a capacitor connected in series.

In an alternative to FIG. 8, the conductor of the first surface 801a of the connector structure 830 and the conductor of the first surface 801b of the guide structure 820 may be disposed to directly contact each other. Accordingly, the connector structure 830 and the guide structure 820 may be connected in the DC manner.

Figure 9:
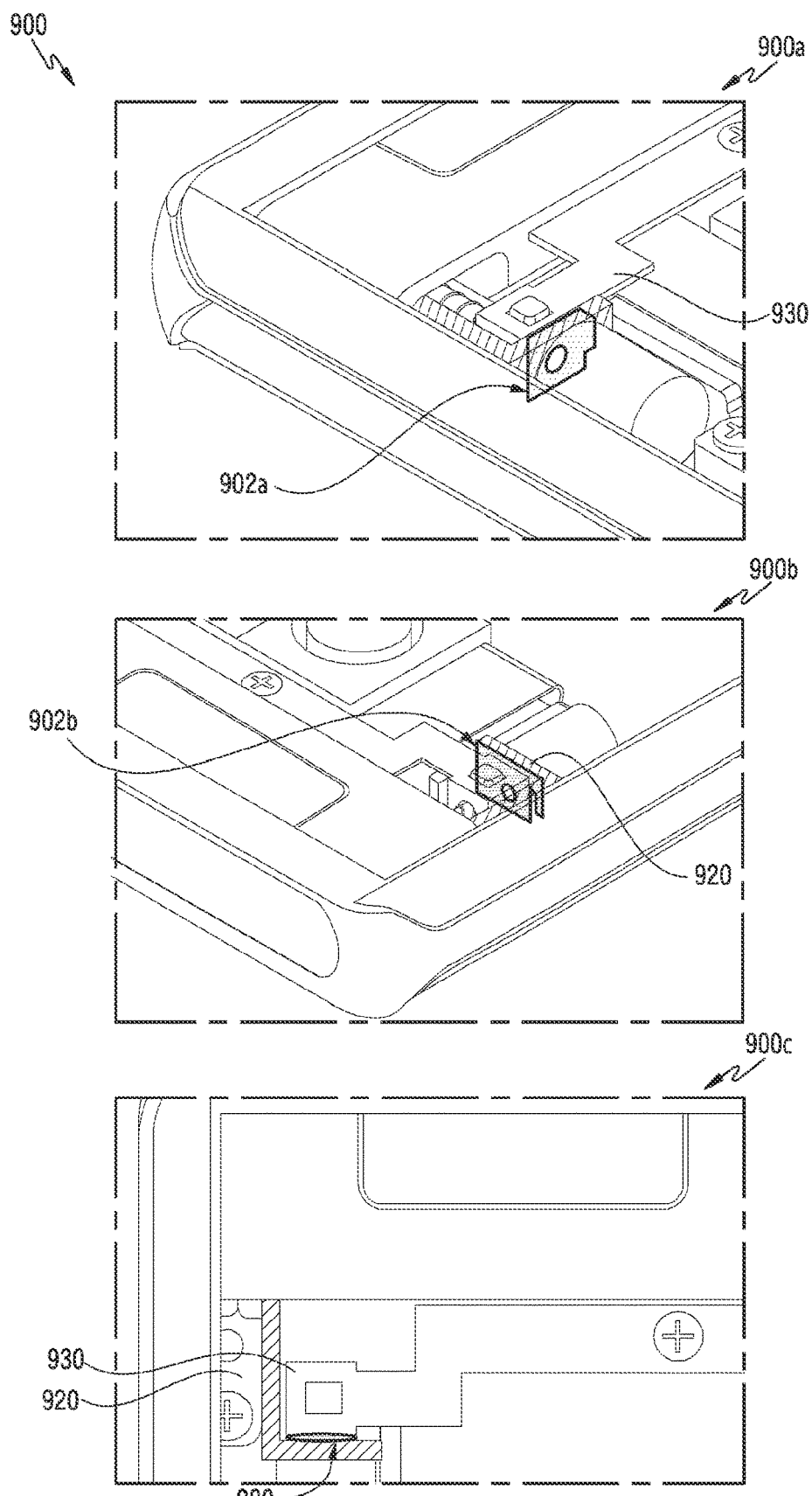
FIG. 9 illustrates an electrical connection between slide structures for a second state, according to an embodiment.

FIG. 9 illustrates an electrical connection between slide structures for a second state, according to an embodiment. In the illustration 900 in FIG. 9, the second state may be the slide-down state in which the slide body may overlap the main body in a greatest amount of area and may be received in the main body. The slide structures may include a guide structure 920 physically connected to the housing of the main body and a connector structure 930 physically connected to the slide body.

Referring to a first perspective view 900a, the connector structure 930 may include a bonding unit including a second surface 902a. The connector structure 930 may have a shape including the second surface 902a for electrically connecting with a second surface 902b of the guide structure 920 in the second state. Referring to a second perspective view 900b, the guide structure 920 may include a guide area including the second surface 902b. The guide structure 920 may have a shape including the second surface 902b for electrically connecting with the second surface 902a of the connector structure 930 in the second state. The second surface 902a of the connector structure 930 and the second surface 902b of the guide structure 920 may be perpendicular to the slide movement direction.

Referring to a front view 900c, electrical connection 990 may be formed through the second surface 902a of the connector structure 930 and the second surface 902b of the guide structure 920. A conductor of the second surface 902a of the connector structure 930 and a conductor of the second surface 902b of the guide structure 920 face each other and may be disposed to form capacitance. The capacitance of the capacitor may be determined based on Equation (1). The descriptions on the first surfaces 801a and 801b of the structures of FIG. 8 may be applied to the descriptions of the second surfaces 902a and 902b of the structures of FIG. 9 in the same or similar manner.

In Equation (1), $\varepsilon$, A, and d are determined depending on physical parameters between the conductor of the second surface 902a of the connector structure 930 and the conductor of the second surface 902b of the guide structure 920, and gap design for efficient arrangement of the two structures may be considered.

The electronic device 101 may include an arrangement structure in which the conductor of the second surface 902a of the connector structure 930 and the conductor of the second surface 902b of the guide structure 920 are spaced apart within a specific range to form the capacitance. The separation distance may be determined based on at least one of a dielectric disposed between the two conductors, an area of each conductor, an overlapping area to form the capacitor, and an operating frequency of a transmitted signal. As the capacitance is formed, the connector structure 930 and the guide structure 920 may be coupled in the AC manner.

In an alternative to FIG. 9, the conductor of the second surface 902a of the connector structure 930 and the conductor of the second surface 902b of the guide structure 920 may be disposed to directly contact each other. Accordingly, the connector structure 930 and the guide structure 920 may be connected in the DC manner.

Figure 10:
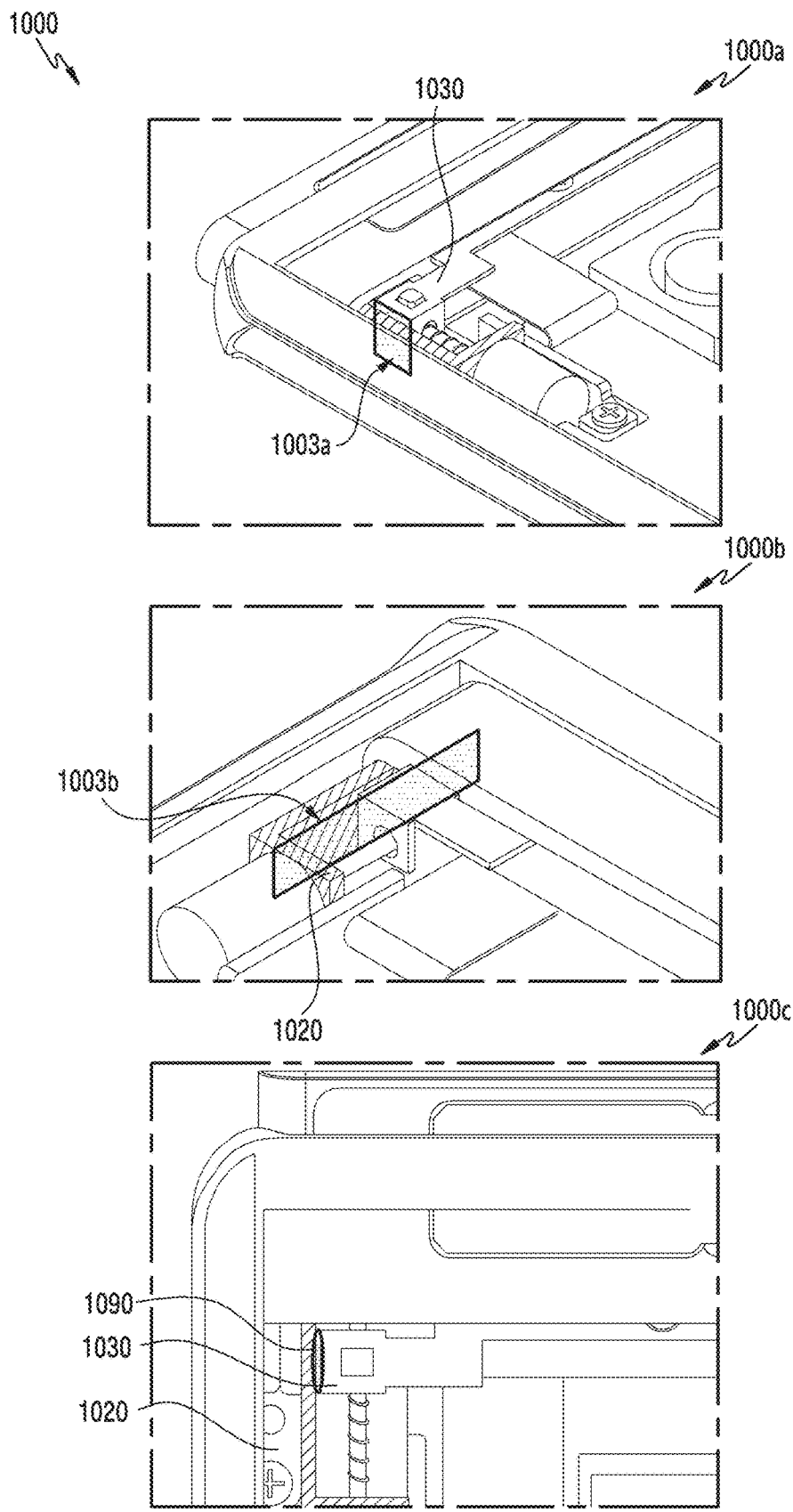
FIG. 10 illustrates an electrical connection between slide structures for a third state, according to an embodiment.

FIG. 10 illustrates an electrical connection between slide structures for a third state, according to an embodiment. In the illustration 1000 in FIG. 10, the third state may be the slide-move directed to the intermediate state between the slide-down state of FIG. 8 and the slide-up state of FIG. 9. The slide body may overlap the main body in a specific range. The slide body may be included in the housing of the main body. The slide structures may include a guide structure 1020 physically connected to the main body and a connector structure 1030 physically connected to the slide body.

Referring to a first perspective view 1000a, the connector structure 1030 may include a bonding unit including a third surface 1003a. The connector structure 1030 may have a shape including the third surface 1003a to electrically connect with a third surface 1003b of the guide structure 1020 in the first state. Referring to a second perspective view 1000b, the guide structure 1020 may include a guide area including the third surface 1003b. The guide structure 1020 may have a shape including the third surface 1003b to electrically connect with the third surface 1003a of the connector structure 1030 in the first state. The third surface 1003a of the connector structure 1030 and the third surface 1003b of the guide structure 1020 may be parallel to the slide movement direction.

Referring to a front view 1000c, electrical connection 1090 may be formed through the third surface 1003a of the connector structure 1030 and the third surface 1003b of the guide structure 1020. A conductor of the third surface 1003a of the connector structure 1030 and a conductor of the third surface 1003b of the guide structure 1020 face each other and may be disposed to build a capacitor. Capacitance of the capacitor may be determined based on Equation (1). The descriptions on the first surfaces 801a and 801b of the structures of FIG. 8 may be applied to the descriptions of the third surfaces 1003a and 1003b of the structures of FIG. 10 in the same or similar manner.

In Equation (1), $\varepsilon$, A, and d are determined depending on physical parameters between the conductor of the third surface 1003a of the connector structure 1030 and the conductor of the third surface 1003b of the guide structure 1020, and gap design for efficient arrangement of the two structures may be considered.

In the electronic device 101, the conductor of the third surface 1003a of the connector structure 1030 and the conductor of the third surface 1003b of the guide structure 1020 are spaced apart within a specific range to form the capacitance. The separation distance may be determined based on at least one of a dielectric disposed between the two conductors, an area of each conductor, an overlapping area to form the capacitance, and an operating frequency of a transmitted signal. As the capacitance is formed, the connector structure 1030 and the guide structure 1020 may be coupled in the AC manner. The formed capacitance may be expressed as equivalent circuitry including a capacitor connected with the connector structure 1030 and the guide structure 1020 in series.

The AC-type electrical connection and the shape and the arrangement between the conductors for adequate capacitance have been described in FIG. 8 and FIG. 10.

Figure 11A:
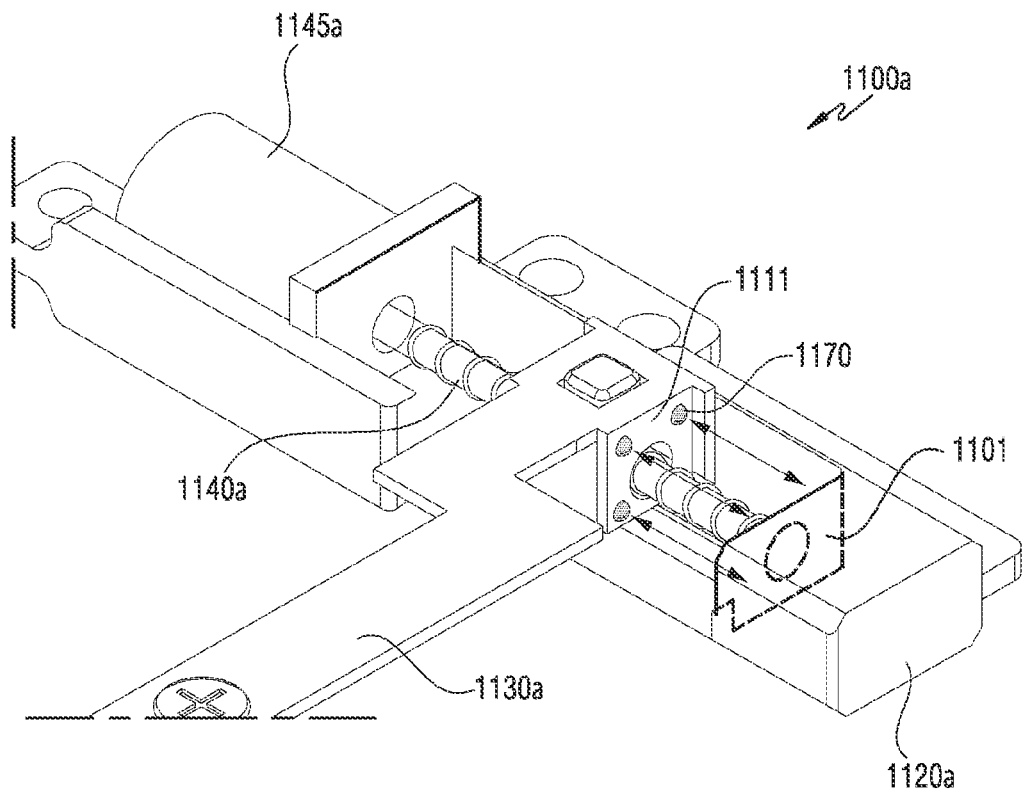
FIG. 11A illustrates a connection between slide structures including a contact member according to a first embodiment.

FIG. 11A illustrates a connection between slide structures including a contact member according to a first embodiment. In the illustration 1100a in FIG. 11A, a first surface 1101 of a guide structure 1120a corresponding to the slide-up state and a first surface 1111 of a connector structure 1130a are physically contacted through a contact member 1170 is described. The contact member 1170 of FIG. 11A may include a conductor for providing stable DC connection during the movement.

Referring to FIG. 11A, the contact member 1170 may be attached to the first surface 1111 of the connector structure 1130a. The first surface 1111 of the connector structure 1130a may include the contact member 1170 which is disposed on the first surface 1111. The contact member 1170 may be disposed to protrude by a specific height on the first surface 1111. The contact member 1170 may include a contact boss. The contact member 1170 may be disposed on each of four edges of the first surface 1111.

The contact member 1170 may include a conductor. The contact member 1170 may be connected to the first surface 1101 of the guide structure 1120a in the DC manner. By moving the first surface 1111 of the connector structure 1130a to the first surface 1101 of the guide structure 1120a through a guide rail 1140a and a driving device 1145a, the contact member 1170 may contact the first surface 1101 of the guide structure 1120a. An accurate contact is formed between the two surfaces through the contact member 1170, thus supplementing electrical connection which may vary according to a gap or an external pressure caused by the slide movement.

It has been described that the contact member 1170 is disposed on the surface of the connector structure 1130a in FIG. 11A, but it is noted that the contact member 1170 may be disposed on the surface of the guide structure 1120a.

Figure 11B:
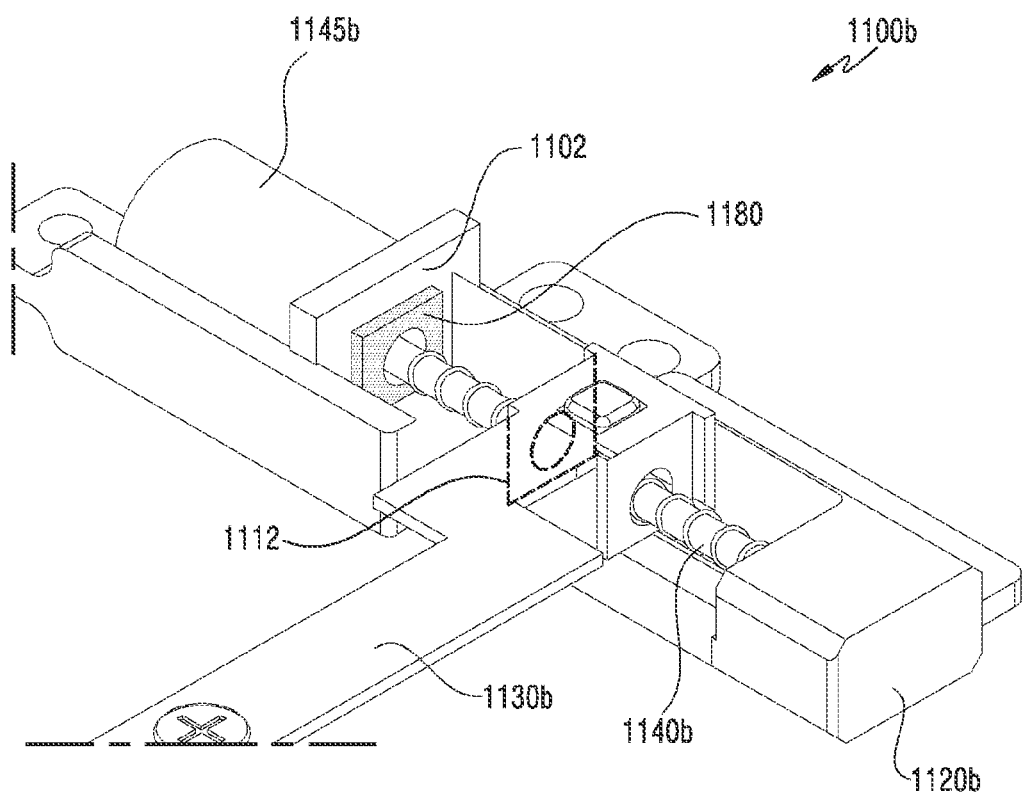
FIG. 11B illustrates a connection between slide structures including a contact member according to a second embodiment.

FIG. 11B illustrates the connection between the slide structures including the contact member according to a second embodiment. In the illustration 1100b in FIG. 11B, a situation in which a second surface 1102 of a guide structure 1120b corresponding to the slide-down state and a second surface 1112 of a connector structure 1130b are physically contacted through a contact member 1180 is described. The contact member 1180 of FIG. 11B may include a conductor for providing the DC connection which is robust to corrosion.

Referring to FIG. 11B, the contact member 1180 may be attached to the second surface 1102 of the guide structure 1120b. The second surface 1102 of the guide structure 1120b may include the contact member 1180. The contact member 1180 may be disposed to protrude by a specific height on the second surface 1102. The contact member 1180 may include a polygonal or a circular conductor.

The contact member 1180 may include a conductive tape. The conductive tape may include a gasket tape. The gasket tape may be disposed to supplement a part which is subject to unevenness due to corrosion. Hence, to prevent abrasion or corrosion due to the DC contact, the electronic device 101 may include the gasket tape disposed on one surface of the guide structure 1120b. Through the gasket tape, it is possible to supplement the electrical connection which may vary according to the corrosion or the abrasion of the contact portion due to the repeated slide movements.

The contact member 1180 may be connected to the second surface 1112 of the connector structure 1130b in the DC manner. The second surface 1112 of the connector structure 1130b moves to the second surface 1102 of the guide structure 1120b through the guide rail 1140b and the driving device 1145b, and accordingly, the contact member 1180 may contact the second surface 1112 of the connector structure 1130b.

In FIG. 11B, the contact member 1180 is disposed on the surface of the guide structure 1120b, but the contact member 1180 may alternatively be disposed on the surface of the connector structure 1130b.

Figure 12:
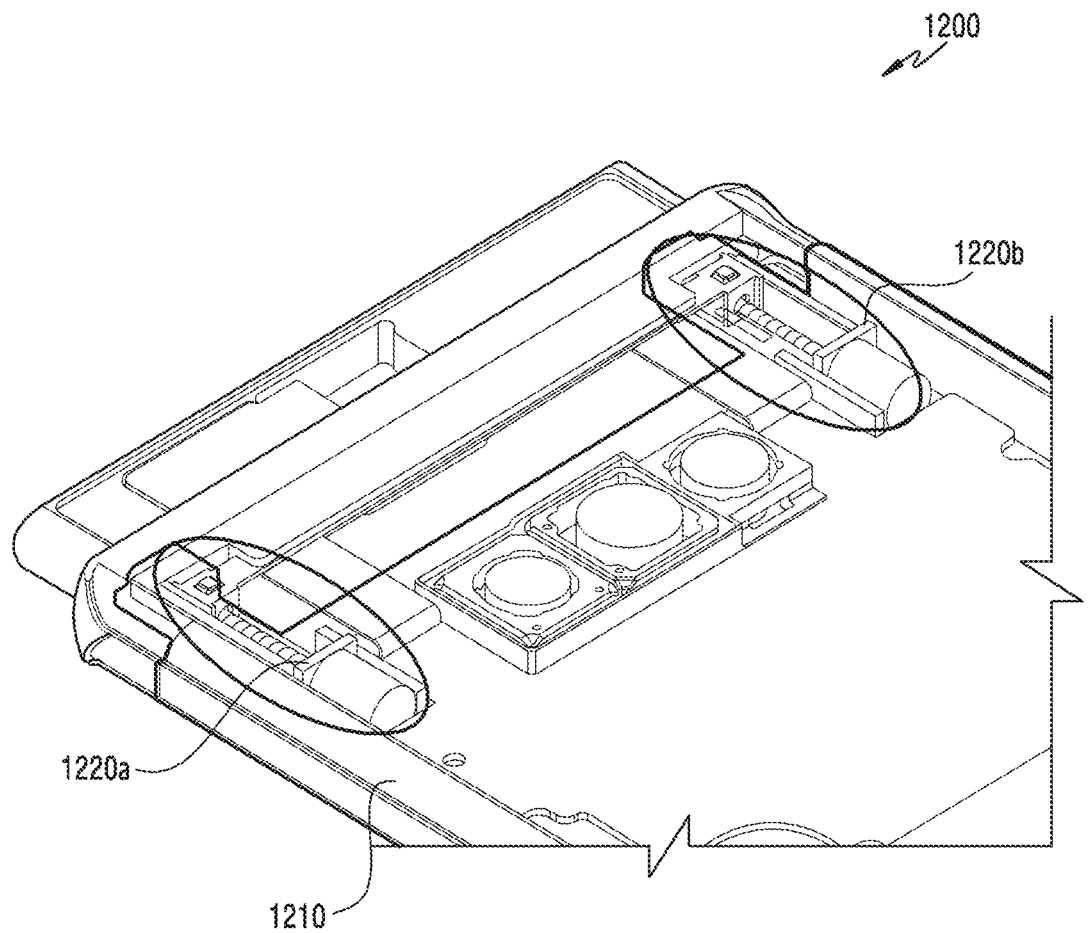
FIG. 12 illustrates connection between slide structures based on computerized numerical control (CNC) processing according to an embodiment.

FIG. 12 illustrates a connection between slide structures based on CNC processing according to an embodiment.

Referring to the illustration 1200 in FIG. 12, the first guide structure 1220a may be CNC-processed and disposed on a housing of a main body 1210. The second guide structure 1220b may be CNC-processed and disposed on the housing of the main body 1210. The CNC processing indicates a scheme of constructing a material with a computerized numerical control processing machine.

Characteristics of the electrical connection formed with the connector structure may differ depending on the arrangement of the guide structures 1220a and 1220b. For example, if a gap occurs due to a design error of the guide structure and the conductor area forming the capacitor reduce by 1 mm, the AC connection may significantly affect the capacitance value. The gap design error may be reduced, by forming a slide assembly which is disposed more precisely on the main body 1210 through the CNC processing.

An electronic device including electronic circuitry may require a ground design for securing EMI performance and a return current path. In particular, in the slide-type electronic device, the slide body may include a plurality of data lines for transmitting a large amount of data. As the communication frequency band increases, the sub-PCB of the slide body may be configured as a high frequency system. In such a system, since the clock speed increases, it is necessary to secure a fast return current path. Thus, additional ground connections may be required for a stable circuitry design.

For a stable ground connection, various methods may be considered in addition to the electrical connection using the DC scheme or the AC manner between the connector structure and the guide structure described herein. By securing additional paths for the sub-PCB besides the path including the electrical connection described herein, the electronic device 101 may secure a sufficient return current path, and thus guarantee the EMI performance.

Figure 13:
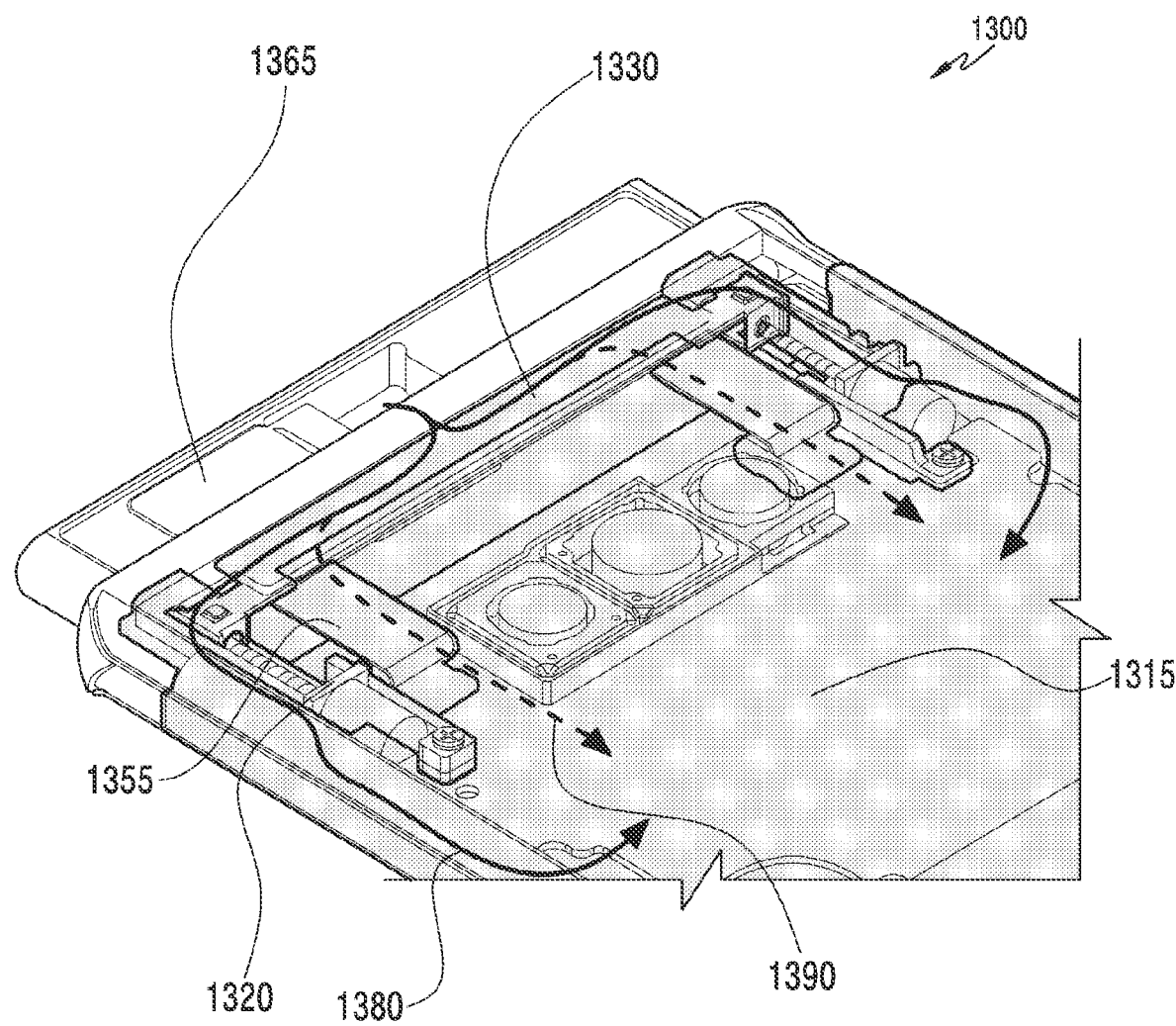
FIG. 13 illustrates a ground path based on connection between slide structures including a flexible print circuit board (FPCB), according to an embodiment.

FIG. 13 illustrates a ground path based on connection between slide structures including an FPCB, according to an embodiment.

Referring to the illustration 1300 in FIG. 13, an electronic device 101 may include a first return current path 1380, based on electrical connection between a guide structure of a main body and a connector structure of a slide body. The first return current path 1380 may include connection of a sub-PCB 1365, a connector structure 1330, a guide structure 1320, and a main PCB 1315 of the slide body. The first return current path 1380 may be formed through the ground connected to the guide structure.

The electronic device may further include a second return current path 1390 in addition to the first return current path 1380. The second return current path may include connection of the sub-PCB 1365, the FPCB 1355, and the main PCB 1315. By securing the additional return current path, the stable ground connection may be provided.

The electronic device may additionally dispose a conductive structure between the slide body and the main body, to build an additional return current path. For example, the conductive structure may include a connect (C)-clip disposed between the slide body and the main body and physically contacting the slide body and the main body. The conductive structure may form a contact to transfer the force in a direction substantially perpendicular to (i.e., by 90 degrees) the movement axis of the slide body.

The electronic device may include both the return current path including the FPCB and the return current path including the C-clip, alternatively or in addition to the electrical connection between the slide structures.

The FPCB of the above-described embodiments may be replaced with a coaxial cable.

Figure 14A:
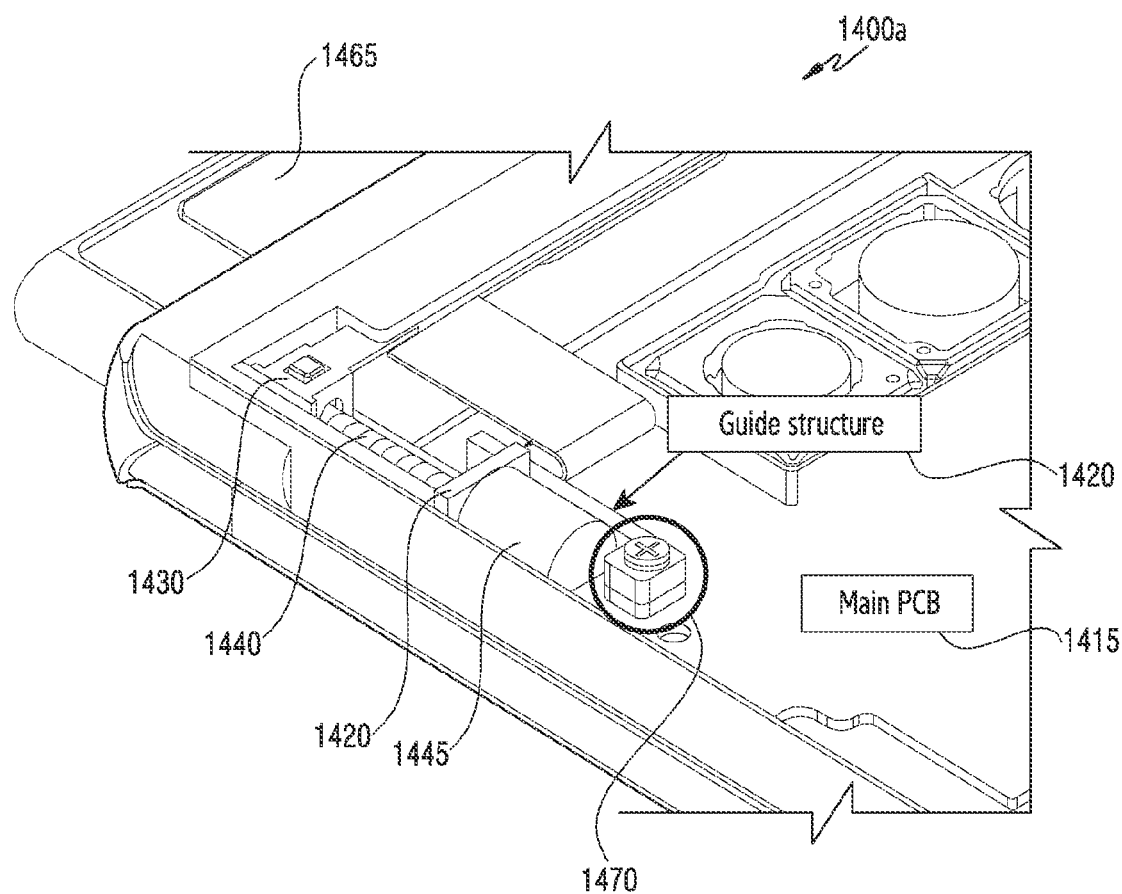
FIG. 14A illustrates connection between slide structures including direct current (DC) insulation, according to an embodiment.

FIG. 14A illustrates a connection between slide structures including DC insulation, according to an embodiment. If an excessive electric current flows in an electronic device 101 and ground connection is not stably formed, the excessive current causes an electric shock to the human body. The main body may include a metal member. Since the metal material conducts the electric current and the user may directly contact the main body, there is a pervasive risk of electric shock.

Accordingly, an electronic device herein may include a main body and a slide body. The main body may include a main PCB 1415, a guide structure 1420, a guide rail 1440, and a driving device 1445. The slide body is connected to the connector structure 1430 and may include a sub-PCB 1465. The main PCB 1415, the guide structure 1420, the connector structure 1430, the guide rail 1440, the driving device 1445, and the sub-PCB 1465 exemplify the main PCB 215, the guide structure 220, the connector structure 230, the guide rail 240, the driving device 245, and the sub-PCB 265 of FIG. 2A respectively, and accordingly the arrangements, the functions, and the shapes described in the disclosure may be applied in the same or similar manner.

Referring to the illustration 1400a in FIG. 14A, to solve the aforementioned electric shock issue, a DC insulation structure 1470 may be included. The DC insulation structure 1470 may be coated with a material (e.g., rubber or synthetic resin) having excellent insulation performance, on a fixing unit which interconnects the guide structure 1420 and the main PCB 1415.

A signal delivered through the guide structure 1420 and the connector structure 1430 may be connected to the main PCB 1415 through the DC insulation structure 1470. A DC component of the signal may be blocked by the DC insulation structure 1470. In addition, the risk of the electric shock may be decreased, by building the return current path to the main PCB 1415 forcedly through the DC insulation structure 1470.

Figure 14B:
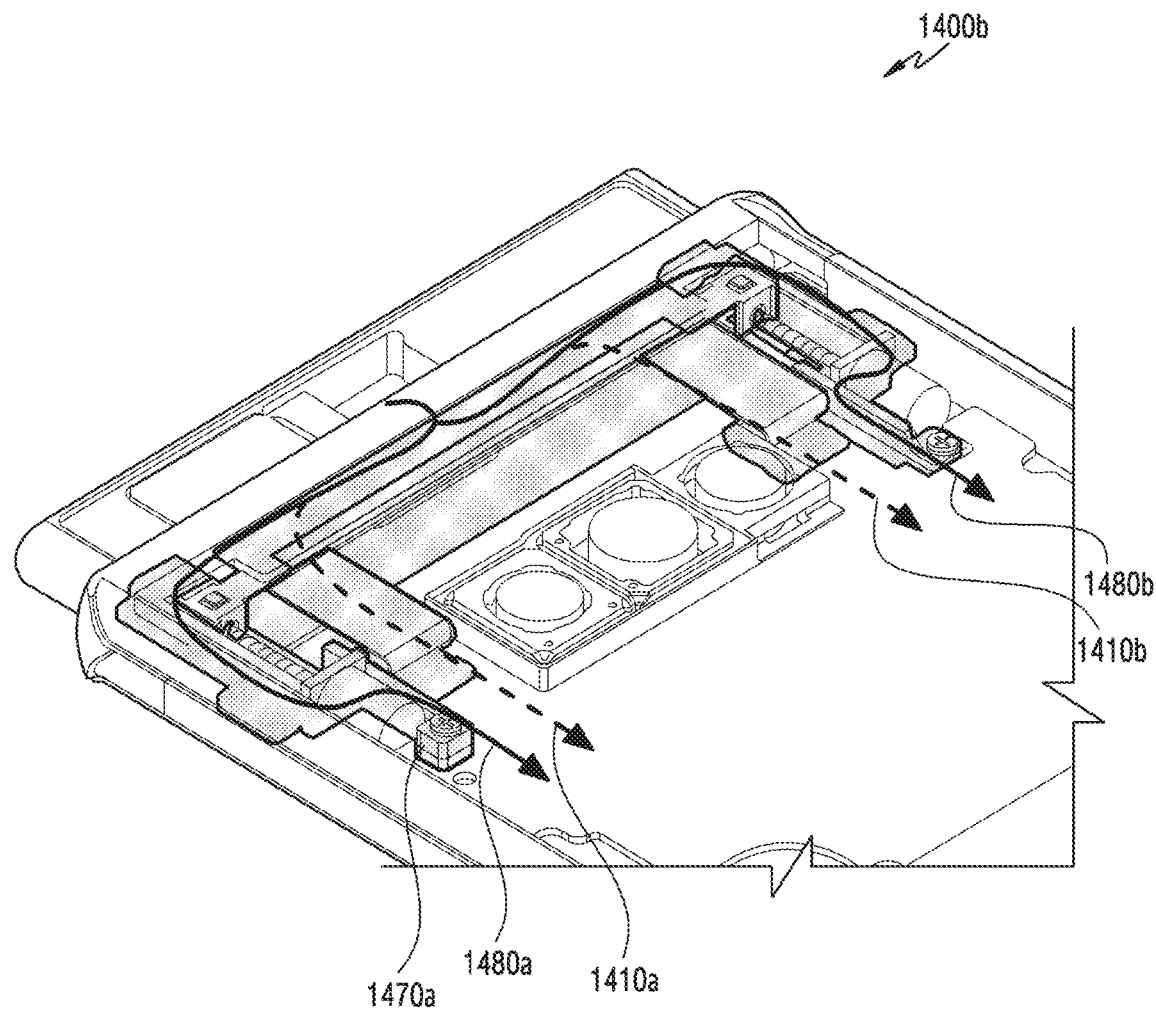
FIG. 14B illustrates a return current path based on connection between slide structures including DC insulation, according to an embodiment.

FIG. 14B illustrates the return current path based on the connection between the slide structures including the DC insulation, according to an embodiment.

Referring to the illustration 1400b in FIG. 14B, a first return current path 1480a including the electrical connection between the first connector structure and the first guide structure and the first insulating structure 1470a may be formed. For the stable ground connection, a path using an FPCB may be additionally configured. The electronic device 101 may further include a second return current path 1410a. The second return current path 1410a may include the connection of the sub-PCB, the FPCB, and the main PCB, as described in reference to FIG. 13. The electronic device may have a symmetrical structure. A third return current path 1480b and a fourth return current path 1410b may be configured substantially the same as the first return current path 1480a and the second return current path 1410a.

Figure 15:
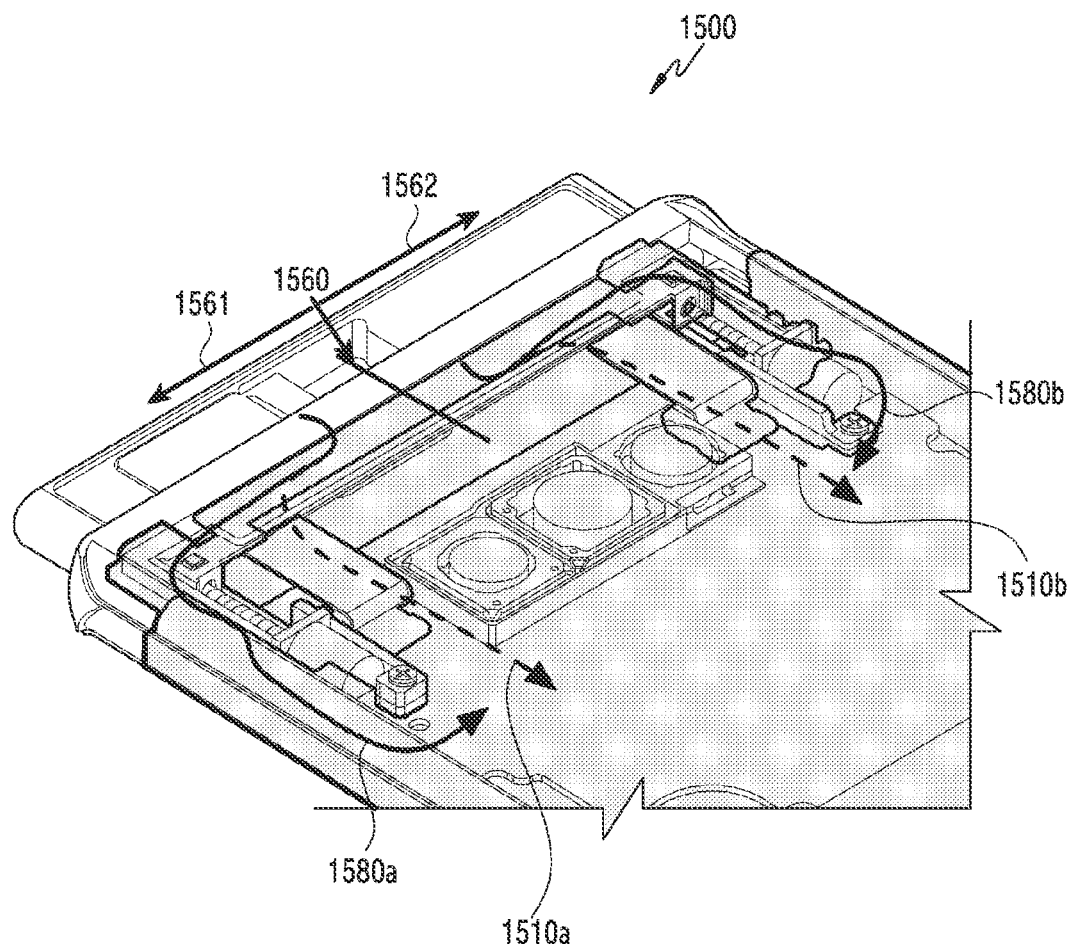
FIG. 15 illustrates a ground path based on connection between slide structures including digital circuitry and analog circuitry, according to an embodiment.

FIG. 15 illustrates a ground path based on connection between slide structures including digital circuitry and analog circuitry, according to an embodiment. If the digital circuitry and the analog circuitry are included, it may be required to separate the ground for the digital circuitry and analog circuitry. The digital circuitry is a first ground path and analog circuitry is a second ground path that is different from the ground path. If the ground is not separated, a rapidly changing signal of the digital circuitry may affect the analog circuitry. If the ground is not separated, common impedance may be formed through the common ground. The common impedance may deliver noise components generating in the digital circuitry to the analog circuitry. These noise components may affect offset values of the analog circuitry which is relatively sensitive and thus lower the performance and stability of the analog circuitry. Hence, FIG. 15 provides a path arrangement for separating the ground for the digital circuitry and the ground for the analog circuitry.

Referring to the illustration 1500 in FIG. 15, the slide body may include a first ground path 1561 and a second ground path 1562 based on a reference line 1560. A sub-PCB of the slide body may include a digital-to-analog converter (DAC) or an analog-to-digital converter (ADC). Both the analog circuitry and the digital circuitry may be configured in the sub-PCB. To ensure a stable design of the circuitry, the electronic device 101 may include the first ground path 1561 for the digital circuitry and the second ground path 1562 for the analog circuitry.

The electronic device may have a dual slide structure. The electronic device may include a first guide structure and a first connector structure. In addition, the electronic device may include a second guide structure and a second connector structure. The first guide structure and the second guide structure each relate to the guide structure 520 or 630.

The electrical connection between the first guide structure and the first connector structure may provide a first return current path 1580a. The first return current path 1580a may be connected to the first ground path 1561 for the digital circuitry and provide a digital ground connection (DGND). The electrical connection between the second guide structure and the second connector structure may provide a second return current path 1580b. The second return current path 1580b may be connected to the second ground path 1562 for the analog circuitry and provide an analog ground connection (AGND).

To ensure a stable ground connection, a path using an FPCB may be additionally configured. The electronic device may further include a third return current path 1510a. The third return current path 1510a may include connection of the sub-PCB, the FPCB, and the main PCB, as described in reference to FIG. 13. The sub-PCB may include the first ground path 1561, and the third return current path 1510a may provide digital ground connection. The electronic device may further include a fourth return current path 1510b. The fourth return current path 1510b may include connection of the sub-PCB, the FPCB, and the main PCB, as described in FIG. 13. The sub-PCB may include the second ground path 1562, and the fourth return current path 1510b may provide analog ground connection.

As described above, an electronic device of a slide type may include a main body, a guide rail coupled with the main body and allowing rotational movement, a driving device coupled with the main body and controlling the rotational movement of the guide rail; a guide structure coupled with the main body, a slide body, and a connector structure coupled with the slide body. The connector structure may be coupled with the guide rail to linearly move according to the rotational movement, the slide body may be flexibly disposed in a designated area according to the linear movement of the connector structure, and one surface of the connector structure and one surface of the guide structure may be configured to form electrical connection.

The electronic device may further include a fixing body for coupling the guide rail and the connector structure, wherein the fixing body may be coupled with the guide rail to linearly move according to the rotational movement and coupled with the connector structure such that the connector structure linearly moves according to the linear movement of the fixing body.

If the connector structure is positioned at an end of the linear movement, the slide body may be disposed at a first position on the designated area. If the connector structure is positioned at the other end of the linear movement, the slide body may be disposed at a second position on the designated area. If the connector structure is positioned between the end and the other end of the linear movement, the slide body may be disposed between the first position and the second position on the designated area.

If the slide body is disposed at the first position, the slide body may overlap the main body in the least area, when viewed from above one surface of the electronic device. If the slide body is disposed at the second position, the slide body may overlap the main body in the largest area, when viewed from above the one surface of the electronic device.

A plurality of guide surfaces of the guide structure may include a first guide surface, a second guide surface, and a third guide surface, and a plurality of bonding surfaces of the connector structure may include a first bonding surface forming first electrical connection with the first guide surface if the slide body is disposed at the first position, a second bonding surface forming second electrical connection with the second guide surface if the slide body is disposed at the second position, and a third bonding surface of the guide structure forming third electrical connection with the third guide surface if the slide body is disposed between the first position and the second position.

The first electrical connection may be DC contact or AC coupling, the second electrical connection may be DC contact or AC coupling, and the third electrical connection may be AC coupling.

At least one of the first bonding surface, the second bonding surface, the third bonding surface, the first guide surface, the second guide surface, or the third guide surface may be anodizing coating processed.

The electronic device may include a contact member which contacts at least one of the first bonding surface, the second bonding surface, the third bonding surface, the first guide surface, the second guide surface, or the third guide surface, wherein the contact member may provide DC contact.

The contact member may include a contact boss and a gasket conductive tape.

The connector structure may be disposed such that the first bonding surface forms a first separation distance with the first guide surface if the slide body is disposed at the first position, such that the second bonding surface forms a second separation distance with the second guide surface if the slide body is disposed at the second position, and such that the third bonding surface forms a third separation distance with the third guide surface if the slide body is disposed between the first position and the second position.

The first separation distance may be determined based on permittivity between the first bonding surface and the first guide surface, the second separation distance may be determined based on permittivity between the second bonding surface and the second guide surface, and the third separation distance may be determined based on permittivity between the third bonding surface and the third guide surface.

The electronic device may further include a first insulator disposed between the first bonding surface and the first guide surface; a second insulator disposed between the second bonding surface and the second guide surface; and a third insulator disposed between the third bonding surface and the third guide surface.

At least one of the first insulator, the second insulator, or the third insulator may include PI film.

At least one of the first separation distance, the second separation distance, or the third separation distance may be based on an operating frequency of a signal transmitted from circuitry of the slide structure to circuitry of the main structure.

The main body may include a first PCB, and the slide body may include a second PCB and an FPCB or a coaxial cable connected to the first PCB and the second PCB.

The main body may include a first PCB, the slide body may include a second PCB, the guide structure may be connected to the first PCB which provides ground, and the connector structure may be connected to the second PCB.

The electronic device may further include an additional connector structure and an additional guide structure, wherein the second PCB may include analog circuitry and digital circuitry, electrical connection between the first PCB and the second PCB according to coupling of the connector structure and the guide structure may provide ground connection for the digital circuitry, and electrical connection between the first PCB and the second PCB according to the additional connector structure and the additional guide structure may provide ground connection for the analog circuitry.

The electronic device may include a first FPCB and a second FPCB connected to the first PCB and the second PCB, wherein the first FPCB may provide ground connection for the digital circuitry, and the second FPCB may provide ground connection for the analog circuitry.

The guide structure may be CNC-processed and disposed on a housing of the main body.

As described above, a slide assembly for an electronic device of a slide type may include a main body, a slide body fluidly disposed in a designated area, and a connector structure connected to the slide body, wherein the main body may include a guide structure forming a plurality of guide surfaces including a first guide surface, a second guide surface, and a third guide surface. The connection structure may form a plurality of bonding surfaces including a first bonding surface, a second bonding surface, and a third bonding surface. If the slide body is disposed at a first position in the designated area, the connection structure may be disposed such that the first bonding surface forms first electrical connection with the first guide surface. If the slide body is disposed at a second position in the designated area, the connection structure may be disposed such that the second bonding surface forms second electrical connection with the second guide surface. If the slide body is disposed at a third position in the designated area, the connection structure may be disposed such that the third bonding surface forms electrical connection with the third guide surface.

The disclosure may include a structure in which DC or AC electrical connection is formed according to each slide operation through structures configured for the slide operation, that is, shape and arrangement between slide structures, rather than connecting a PCB of a slide body and a PCB of a main body by using only a flexible structure such as an FPCB/coaxial cable and a physical contact structure such as a C-clip in a slide-type electronic device. At least one of the flexible structure or the physical contact structure may be designed as an additional path.

By changing shape and arrangement of structures for the existing slide operation, improvement of hardware performance may be achieved without an additional structure for circuitry connection. Additional structure insertion is not required and design cost of the structure may be reduced. In addition, the electronic device 101 may avoid forming a contact using a contact member, including various recovery current paths for ground connection, or using a single physical contact structure, and thus minimize performance degradation problem due to characteristics change such as corrosion or abrasion.

The methods according to the embodiments described in the claims or the specification of the disclosure may be implemented in software, hardware, or a combination of hardware and software.

As for the software, a computer-readable storage medium storing one or more programs (software modules) may be provided. One or more programs stored in the computer-readable storage medium may be configured for execution by one or more processors of an electronic device. One or more programs may include instructions for controlling the electronic device to execute the methods of the disclosure.

Such a program (software module, software) may be stored to a random access memory, a non-volatile memory including a flash memory, a read only memory (ROM), an electrically erasable programmable ROM (EEPROM), a magnetic disc storage device, a compact disc (CD)-ROM, digital versatile discs (DVDs) or other optical storage devices, and a magnetic cassette. Alternatively, the program may be stored to a memory combining part or all of those recording media. A plurality of memories may be included.

In addition, the program may be stored in an attachable storage device accessible via a communication network such as Internet, Intranet, local area network (LAN), wide LAN (WLAN), or storage area network (SAN), or a communication network by combining these networks. Such a storage device may access a device which executes an embodiment of the disclosure through an external port. A separate storage device on the communication network may access the device which executes an embodiment of the disclosure.

The elements included in the disclosure are expressed in a singular or plural form. However, the singular or plural expression is appropriately selected for the convenience of explanation, the disclosure is not limited to a single element or a plurality of elements, the elements expressed in the plural form may be configured as a single element, and the elements expressed in the singular form may be configured as a plurality of elements.

While the present disclosure has been described with reference to various embodiments, various changes may be made without departing from the spirit and the scope of the present disclosure, which is defined, not by the detailed description and embodiments, but by the appended claims and their equivalents.

What is claimed is:

1. An electronic device of a slide type, the electronic device comprising:
a main body;
a guide rail coupled with the main body and configured to enable rotational movement;
a driving device coupled with the main body and configured to control the rotational movement of the guide rail;
a guide structure coupled with the main body;
a slide body;
a connector structure coupled with the slide body;
an additional connector structure; and
an additional guide structure,
wherein the connector structure is coupled with the guide rail to linearly move according to the rotational movement,
wherein the slide body is flexibly disposed in a designated area according to the linear movement of the connector structure,
wherein one surface of the connector structure and one surface of the guide structure are configured to form an electrical connection,
wherein the main body comprises a first printed circuit board (PCB),
wherein the slide body comprises a second PCB,
wherein the guide structure is connected to the first PCB which provides ground,
wherein the connector structure is connected to the second PCB,
wherein the second PCB comprises analog circuitry and digital circuitry,
wherein electrical connection between the first PCB and the second PCB according to coupling of the connector structure and the guide structure provides a ground connection for the digital circuitry, and
wherein electrical connection between the first PCB and the second PCB according to the additional connector structure and the additional guide structure provides a ground connection for the analog circuitry.

2. The electronic device of claim 1, further comprising:
a fixing body configured to couple the guide rail and the connector structure,
wherein the fixing body is coupled with the guide rail to linearly move according to the rotational movement, and is coupled with the connector structure such that the connector structure linearly moves according to the linear movement of the fixing body.

3. The electronic device of claim 2,
wherein, if the connector structure is positioned at a first end of the linear movement, the slide body is disposed at a first position on the designated area,
wherein, if the connector structure is positioned at a second end of the linear movement, the slide body is disposed at a second position on the designated area, and
wherein, if the connector structure is positioned between the first end and the second end of the linear movement, the slide body is disposed between the first position and the second position on the designated area.

4. The electronic device of claim 3,
wherein, if the slide body is disposed at the first position, the slide body protrudes from a housing of the main body, when viewed from above one surface of the electronic device, and
wherein, if the slide body is disposed at the second position, the slide body is received in the housing of the main body, when viewed from above the one surface of the electronic device.

5. The electronic device of claim 3,
wherein a plurality of guide surfaces of the guide structure comprises a first guide surface, a second guide surface, and a third guide surface, and
wherein a plurality of bonding surfaces of the connector structure comprises,
a first bonding surface forming a first electrical connection with the first guide surface, if the slide body is disposed at the first position;
a second bonding surface forming a second electrical connection with the second guide surface, if the slide body is disposed at the second position, and a third bonding surface forming a third electrical connection with the third guide surface, if the slide body is disposed between the first position and the second position.

6. The electronic device of claim 5,
wherein the first electrical connection is a direct current (DC) contact or an alternating current (AC) coupling,
wherein the second electrical connection is the DC contact or the AC coupling, and
wherein the third electrical connection is the AC coupling.

7. The electronic device of claim 6, comprising:
a contact member which contacts at least one of the first bonding surface, the second bonding surface, the third bonding surface, the first guide surface, the second guide surface, and the third guide surface,
wherein the contact member provides the DC contact.

8. The electronic device of claim 5,
wherein the connector structure is disposed:
such that the first bonding surface forms a first separation distance with the first guide surface, if the slide body is disposed at the first position,
such that the second bonding surface forms a second separation distance with the second guide surface, if the slide body is disposed at the second position, and
such that the third bonding surface forms a third separation distance with the third guide surface if the slide body is disposed between the first position and the second position.

9. The electronic device of claim 8,
wherein the first separation distance is determined based on permittivity between the first bonding surface and the first guide surface,
wherein the second separation distance is determined based on permittivity between the second bonding surface and the second guide surface, and
wherein the third separation distance is determined based on permittivity between the third bonding surface and the third guide surface.

10. The electronic device of claim 9, further comprising:
a first insulator disposed between the first bonding surface and the first guide surface;
a second insulator disposed between the second bonding surface and the second guide surface; and
a third insulator disposed between the third bonding surface and the third guide surface.

11. The electronic device of claim 8,
wherein at least one of the first separation distance, the second separation distance, and the third separation distance is based on an operating frequency of a signal transmitted from circuitry of the slide body to circuitry of the main body.

12. The electronic device of claim 1,
wherein the electronic device further comprises a flexible PCB (FPCB) or a coaxial cable connected to the first PCB and the second PCB.

13. The electronic device of claim 1, further comprising:
a first FPCB and a second FPCB connected to the first PCB and the second PCB,
wherein the first FPCB provides the ground connection for the digital circuitry, and
the second FPCB provides the ground connection for the analog circuitry.

14. The electronic device of claim 6,
wherein at least one of the first bonding surface, the second bonding surface, the third bonding surface, the first guide surface, the second guide surface, and the third guide surface is subjected to an anodizing coating process.

15. The electronic device of claim 7,
wherein the contact member includes a contact boss.

16. The electronic device of claim 7,
wherein the contact member includes a gasket conductive tape.

17. The electronic device of claim 10,
wherein at least one of the first insulator, the second insulator, or the third insulator includes a polyimide (PI) film.

18. The electronic device of claim 1,
wherein the guide structure is disposed on a housing of the main body by computerized numerical control processing.

* * * * *